(12) United States Patent
Arakawa et al.

(10) Patent No.: US 11,581,477 B2
(45) Date of Patent: Feb. 14, 2023

(54) VIBRATOR, PIEZOELECTRIC ACTUATOR, PIEZOELECTRIC MOTOR, ROBOT, ELECTRONIC COMPONENT CONVEYANCE APPARATUS, AND MANUFACTURING METHOD OF VIBRATOR

(71) Applicant: Seiko Epson Corporation, Tokyo (JP)

(72) Inventors: Yutaka Arakawa, Hara (JP); Noboru Furuya, Chino (JP); Akio Konishi, Matsumoto (JP)

(73) Assignee: Seiko Epson Corporation

( * ) Notice: Subject to any disclaimer, the term of this patent is extended or adjusted under 35 U.S.C. 154(b) by 1424 days.

(21) Appl. No.: 15/689,373

(22) Filed: Aug. 29, 2017

(65) Prior Publication Data

US 2018/0062065 A1     Mar. 1, 2018

(30) Foreign Application Priority Data

Aug. 31, 2016   (JP) .............................. JP2016-170176

(51) Int. Cl.
| | | |
|---|---|---|
| *H01L 41/047* | (2006.01) |
| *B65G 27/24* | (2006.01) |
| *B25J 9/12* | (2006.01) |
| *H01L 41/053* | (2006.01) |
| *H01L 41/083* | (2006.01) |
| *H01L 41/29* | (2013.01) |
| *B06B 1/14* | (2006.01) |
| *B65G 35/06* | (2006.01) |
| *B06B 1/06* | (2006.01) |
| *H01L 41/04* | (2006.01) |

(Continued)

(52) U.S. Cl.
CPC ........ *H01L 41/0475* (2013.01); *B06B 1/0603* (2013.01); *B25J 9/12* (2013.01); *B65G 27/24* (2013.01); *H01L 41/042* (2013.01); *H01L 41/047* (2013.01); *H01L 41/053* (2013.01); *H01L 41/083* (2013.01); *H01L 41/0913* (2013.01); *H01L 41/29* (2013.01); *H02N 2/103* (2013.01); *B06B 1/14* (2013.01); *B25J 9/126* (2013.01); *B65G 35/06* (2013.01)

(58) Field of Classification Search
CPC .... H01L 41/0475; H01L 41/04; H01L 41/083
See application file for complete search history.

(56) References Cited

U.S. PATENT DOCUMENTS 7,253,552 B2 * 8/2007 Miyazawa ............. H02N 2/103
                                                                      310/323.16
9,666,785 B2 * 5/2017 Iwazaki .................. H02P 25/32

(Continued)

FOREIGN PATENT DOCUMENTS

| CN | 105375815 A | 3/2016 |
| JP | 09-098590 A | 4/1997 |

(Continued)

*Primary Examiner* — Shawki S Ismail
*Assistant Examiner* — Karen B Addison
(74) *Attorney, Agent, or Firm* — Harness, Dickey & Pierce, P.L.C.

(57) ABSTRACT

A vibrator includes a vibrating part including a pair of vibrating plates and a piezoelectric material provided between the pair of vibrating plates, a supporting part including a pair of supporting plates and an interplate portion provided between the pair of supporting plates, and a wire provided in the vibrating part and the supporting part, wherein the wire is exposed from the supporting part.

19 Claims, 18 Drawing Sheets

(51) Int. Cl.
*H01L 41/09* (2006.01)
*H02N 2/10* (2006.01)

(56) References Cited

U.S. PATENT DOCUMENTS

| | | | |
|---|---|---|---|
| 10,680,156 B2 * | 6/2020 | Arakawa | ............... H01L 41/042 |
| 2013/0255427 A1 | 10/2013 | Mizushima et al. | |
| 2016/0049574 A1 | 2/2016 | Iwazaki et al. | |
| 2017/0229634 A1 | 8/2017 | Iwazaki et al. | |

FOREIGN PATENT DOCUMENTS

| | | | | |
|---|---|---|---|---|
| JP | 3719061 B2 | 11/2005 | | |
| JP | 2006-340503 A | 12/2006 | | |
| JP | 2013-207978 A | 10/2013 | | |
| JP | 2013-250284 A | 12/2013 | | |
| JP | 2016-04989 | * 3/2016 | ............... | H02A 2/00 |

* cited by examiner

VIBRATOR, PIEZOELECTRIC ACTUATOR, PIEZOELECTRIC MOTOR, ROBOT, ELECTRONIC COMPONENT CONVEYANCE APPARATUS, AND MANUFACTURING METHOD OF VIBRATOR

BACKGROUND

1. Technical Field

The present invention relates to a vibrator, piezoelectric actuator, piezoelectric motor, robot, electronic component conveyance apparatus, and manufacturing method of the vibrator.

2. Related Art

In related art, piezoelectric actuators including piezoelectric elements are known (e.g. see Patent Document 1 (JP-A-2006-340503)). The piezoelectric actuator described in Patent Document 1 includes a vibrator having two reinforcing plates and a piezoelectric element provided between the two reinforcing plates. Further, a wire of the piezoelectric element is exposed from the side surface of the vibrator to the outside, and external electrical connection can be made via the exposed portion (hereinafter, also referred to as "terminal").

Here, in the field of piezoelectric actuators, in addition to the above described vibrator, a supporting part that supports the vibrator and fixes the piezoelectric actuator to an object may be provided. Further, the supporting part is generally provided around the vibrator in a plan view in the thickness direction of the vibrator. If the supporting part is applied to the piezoelectric actuator of Patent Document 1, the side surface of the vibrator faces the supporting part, and the external electrical connection via the terminal exposed from the side surface of the vibrator to the outside may be harder (it may be impossible to secure the sufficient space for the connection).

SUMMARY

An advantage of some aspects of the invention is to provide a vibrator that may easily make external electrical connection and a piezoelectric actuator, piezoelectric motor, robot, and electronic component conveyance apparatus including the vibrators, and further, a manufacturing method of the vibrator.

The advantage can be achieved by the following configurations.

A vibrator according to an aspect of the invention includes a vibrating part including a pair of vibrating plates and a piezoelectric material provided between the pair of vibrating plates, a supporting part including a pair of supporting plates and an interplate portion provided between the pair of supporting plates, and a wire provided in the vibrating part and the supporting part, wherein the wire is exposed from the supporting part.

With this configuration, the vibrator that may easily make external electrical connection may be provided.

In the vibrator according to the aspect of the invention, it is preferable that the interplate portion has an insulation property.

With this configuration, the wire may be easily provided.

In the vibrator according to the aspect of the invention, it is preferable that a first substrate including one of the vibrating plates and one of the supporting plates, and a second substrate including the other of the vibrating plates and the other of the supporting plates are provided.

With this configuration, the configuration of the vibrator is simpler. Further, the manufacture of the vibrator is easier.

In the vibrator according to the aspect of the invention, it is preferable that the interplate portion has a smaller thickness than the piezoelectric material in a direction in which the first substrate and the second substrate overlap.

With this configuration, the first, second substrates and the piezoelectric material may be bonded more reliably.

In the vibrator according to the aspect of the invention, it is preferable that the wire includes a first wire provided on the first substrate and a second wire provided on the second substrate.

With this configuration, short circuit between the first wire and the second wire may be prevented and the degree of freedom of placement of the first wire and the second wire may be improved.

In the vibrator according to the aspect of the invention, it is preferable that the supporting part includes a concave portion opening to a surface and the wire is exposed in the concave portion.

With this configuration, the wire is easily exposed from the supporting part.

In the vibrator according to the aspect of the invention, it is preferable that a conductor portion in contact with the exposed portion of the wire is provided.

With this configuration, the external electrical connection is easier.

In the vibrator according to the aspect of the invention, it is preferable that the conductor portion is provided to protrude from the supporting part.

With this configuration, the external electrical connection is easier.

In the vibrator according to the aspect of the invention, it is preferable that a plurality of the piezoelectric materials stacked along a direction in which the pair of vibrating plates overlap are provided between the pair of vibrating plates.

With this configuration, in comparison between the vibrators having the same thickness, the drive force of the vibrator may be made higher than that of a configuration with a single-layer piezoelectric material.

A piezoelectric actuator according to an aspect of the invention includes the vibrator according to the aspect of the invention, and a convex portion provided in the vibrator.

With this configuration, the vibration of the vibrating part may be efficiently transmitted from the convex portion to an object.

In the piezoelectric actuator according to the aspect of the invention, it is preferable that a plurality of the vibrators are provided and the plurality of the vibrators are stacked.

With this configuration, the drive force of the piezoelectric actuator may be made higher.

In the piezoelectric actuator according to the aspect of the invention, it is preferable that a circuit component electrically connected to the wire in the supporting part is provided.

With this configuration, the wire of the vibrator may be easily led by the circuit component.

A piezoelectric motor according to an aspect of the invention includes the vibrator according to the aspect of the invention.

With this configuration, the piezoelectric motor with higher reliability may be obtained.

A robot according to an aspect of the invention includes the vibrator according to the aspect of the invention.

With this configuration, the robot with higher reliability may be obtained.

An electronic component conveyance apparatus according to an aspect of the invention includes the vibrator according to the aspect of the invention.

With this configuration, the electronic component conveyance apparatus with higher reliability may be obtained.

A manufacturing method of a vibrator according to an aspect of the invention includes preparing a vibrator including a vibrating part including a pair of vibrating plates and a piezoelectric material provided between the pair of vibrating plates, a supporting part including a pair of supporting plates and an interplate portion provided between the pair of supporting plates, and a wire provided in the vibrating part and the supporting part and including an exposed portion exposed from the supporting part to the outside, and forming a conductor portion in contact with the exposed portion by plating.

With this configuration, the vibrator that may easily make external electrical connection via the conductor portion may be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

As below, a vibrator, piezoelectric actuator, piezoelectric motor, robot, electronic component conveyance apparatus, and manufacturing method of the vibrator according to the invention will be explained in detail based on embodiments shown in the accompanying drawings.

First Embodiment

First, a piezoelectric motor according to the first embodiment of the invention will be explained.

Figure 1:
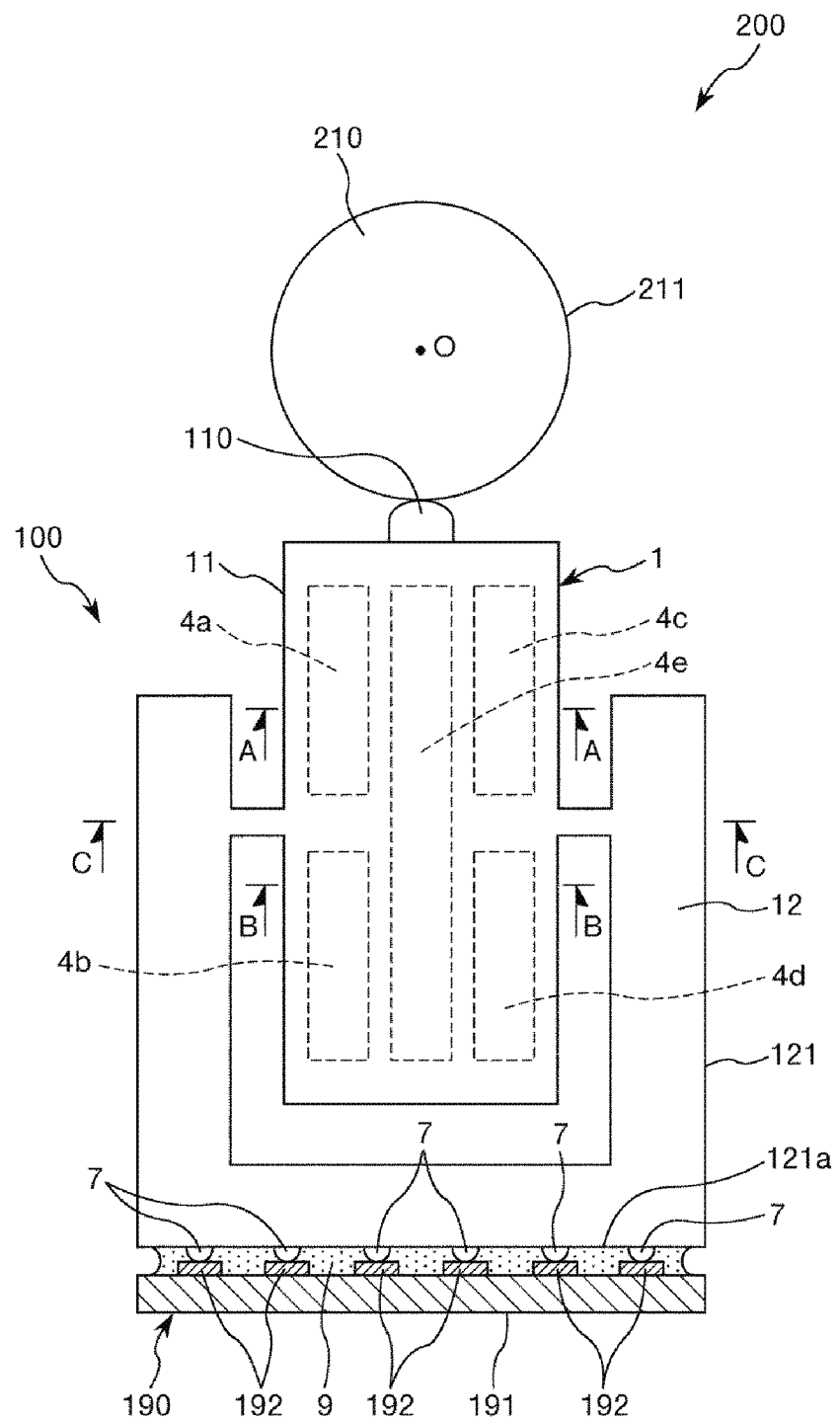
FIG. 1 is a schematic view showing an overall configuration of a piezoelectric motor according to the first embodiment of the invention.
Figure 2:
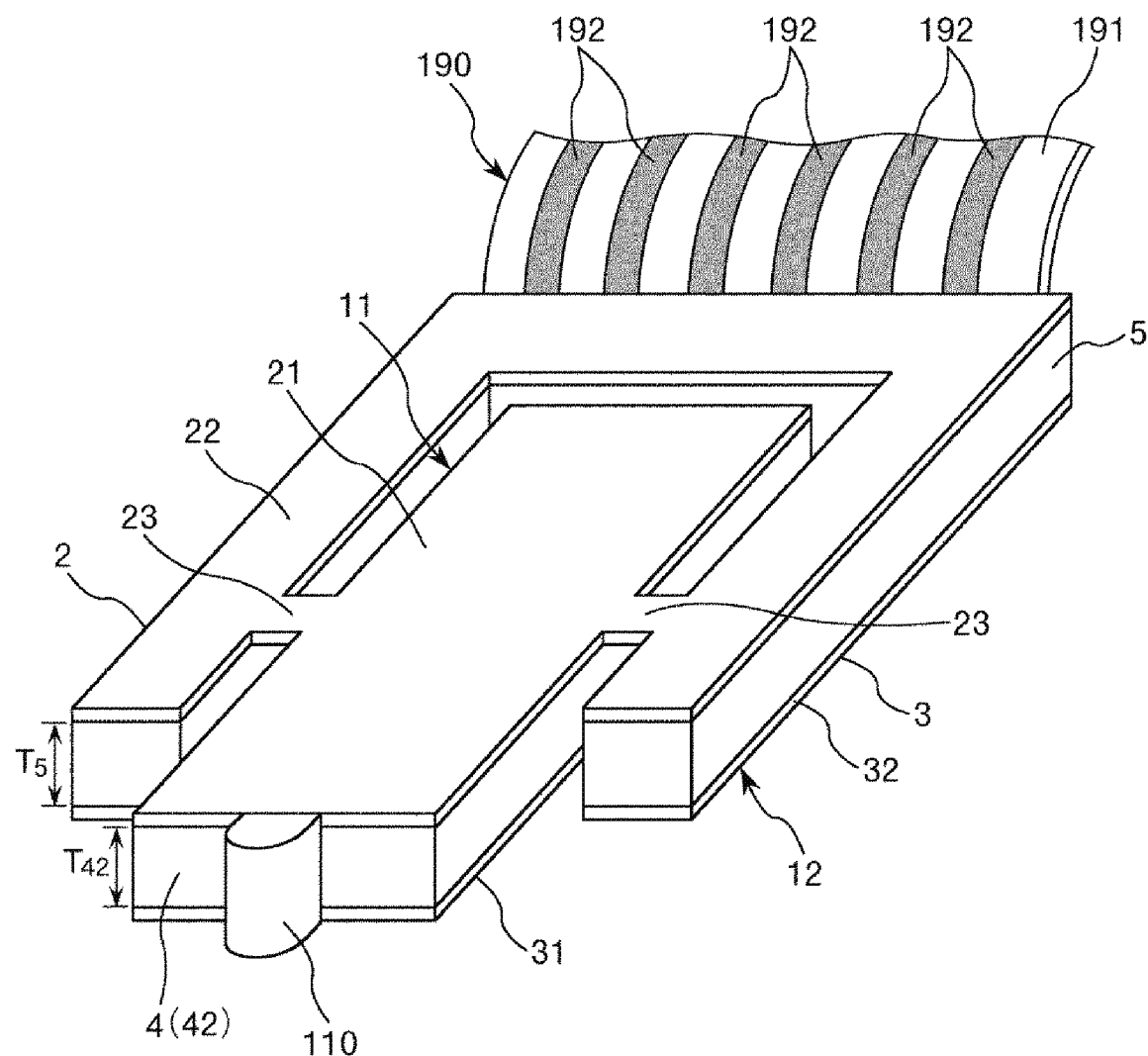
FIG. 2 is a perspective view of a piezoelectric actuator of the piezoelectric motor shown in FIG. 1.
Figure 3A:
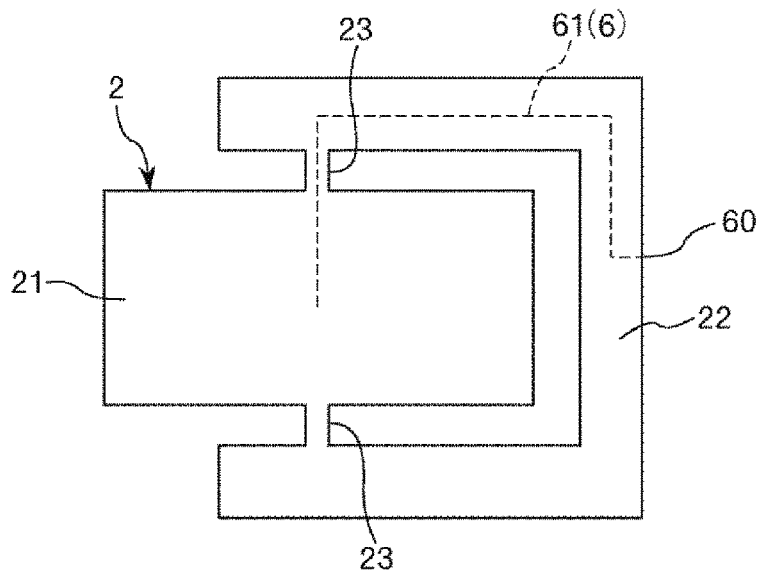
FIG. 3A is a top view of a first substrate of a vibrator.
Figure 3B:
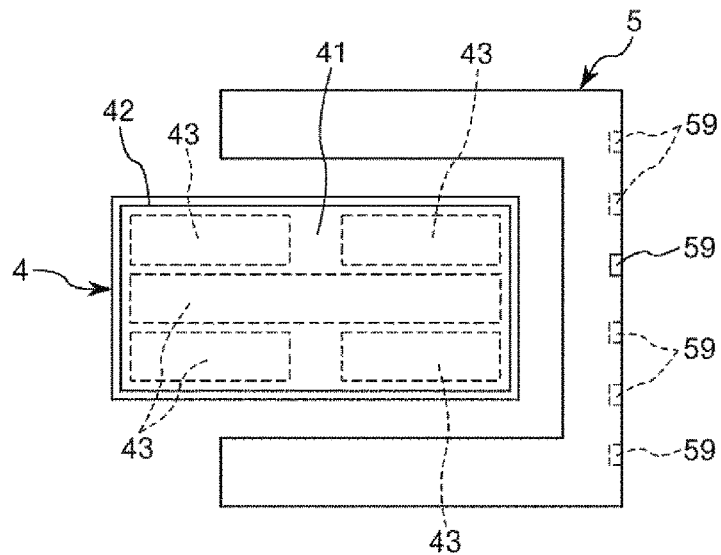
FIG. 3B is a top view of a piezoelectric element and an interplate portion of the vibrator.
Figure 3C:
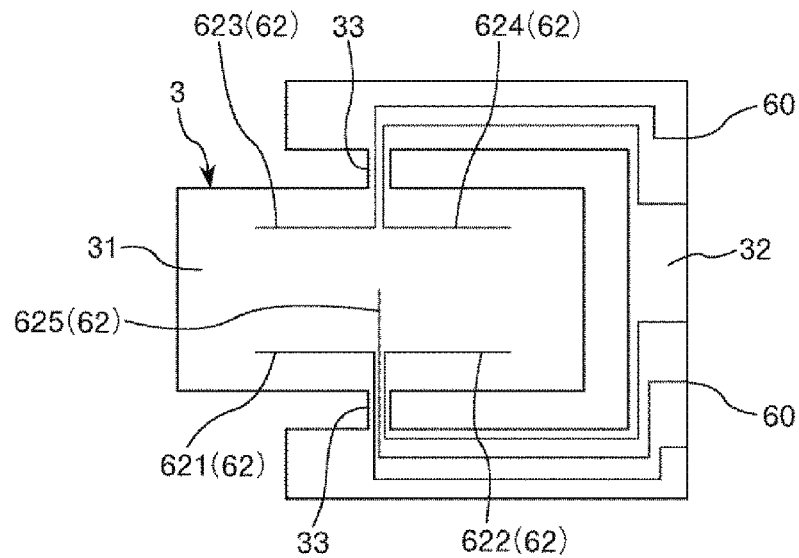
FIG. 3C is a top view of a second substrate of the vibrator.
Figure 4A:
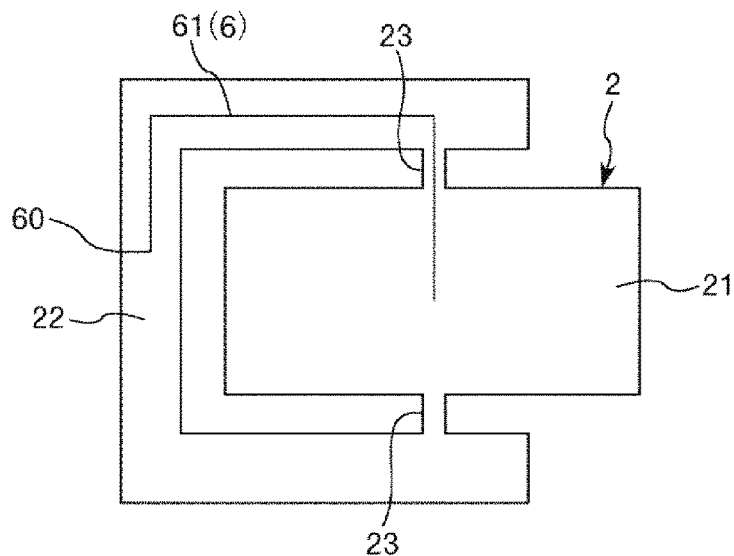
FIG. 4A is a bottom view of the first substrate of the vibrator.
Figure 4B:
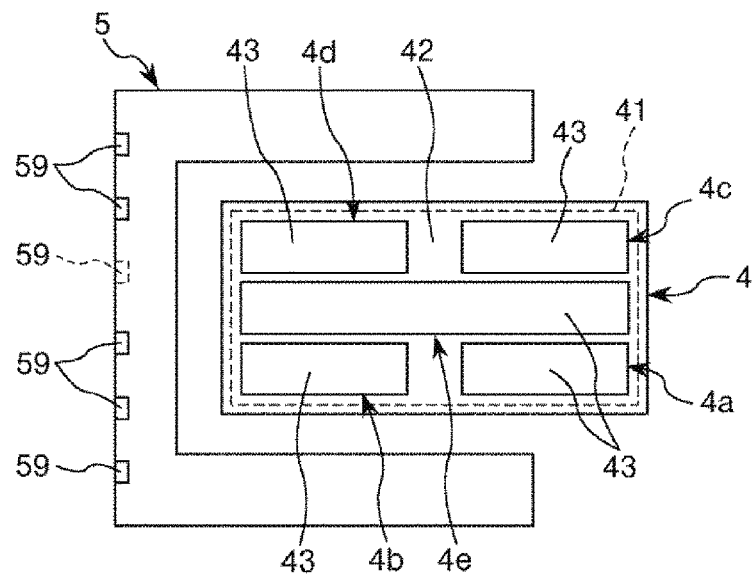
FIG. 4B is a bottom view of the piezoelectric element and the interplate portion of the vibrator.
Figure 4C:
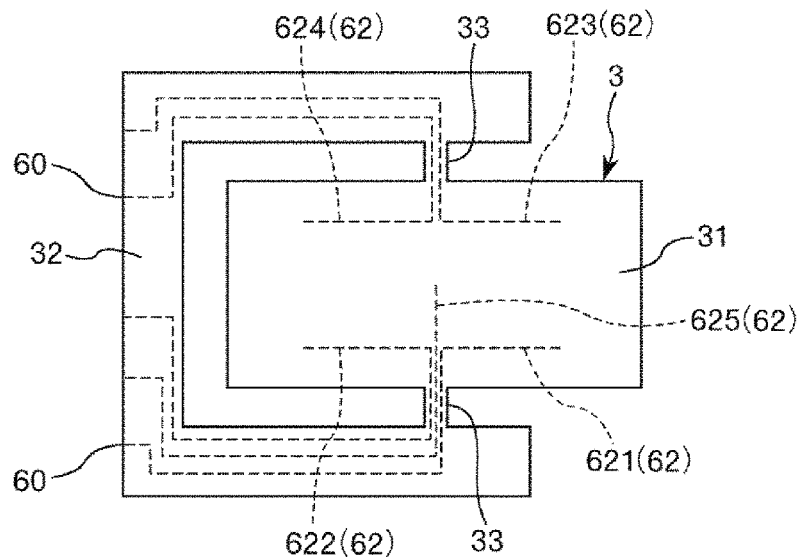
FIG. 4C is a bottom view of the second substrate of the vibrator.
Figure 5:
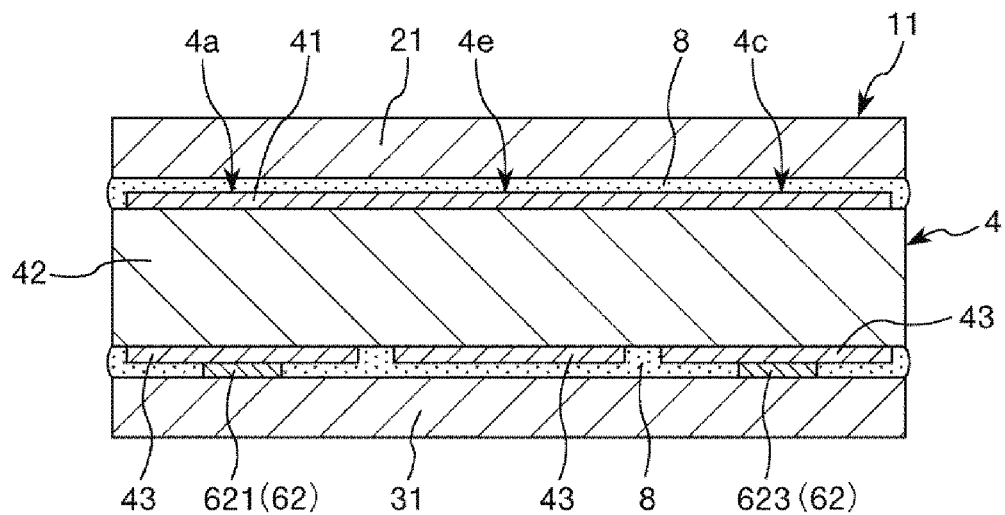
FIG. 5 is a sectional view along line A-A in FIG. 1.
Figure 6:
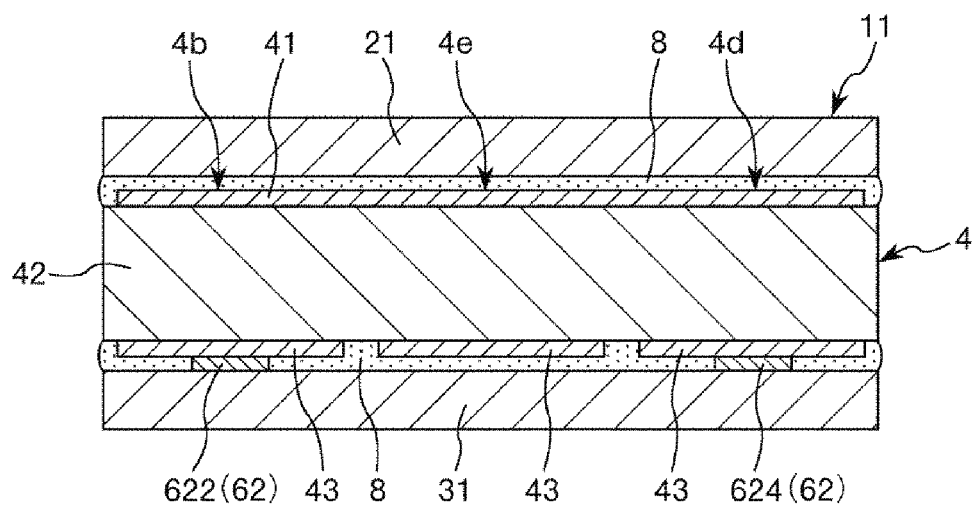
FIG. 6 is a sectional view along line B-B in FIG. 1.
Figure 7:
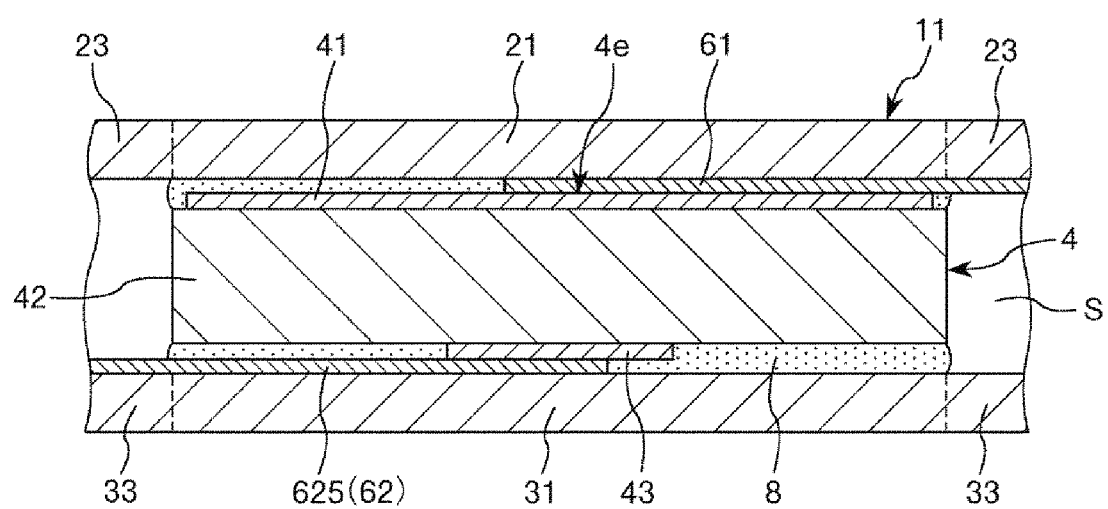
FIG. 7 is a sectional view along line C-C in FIG. 1.
Figure 8:
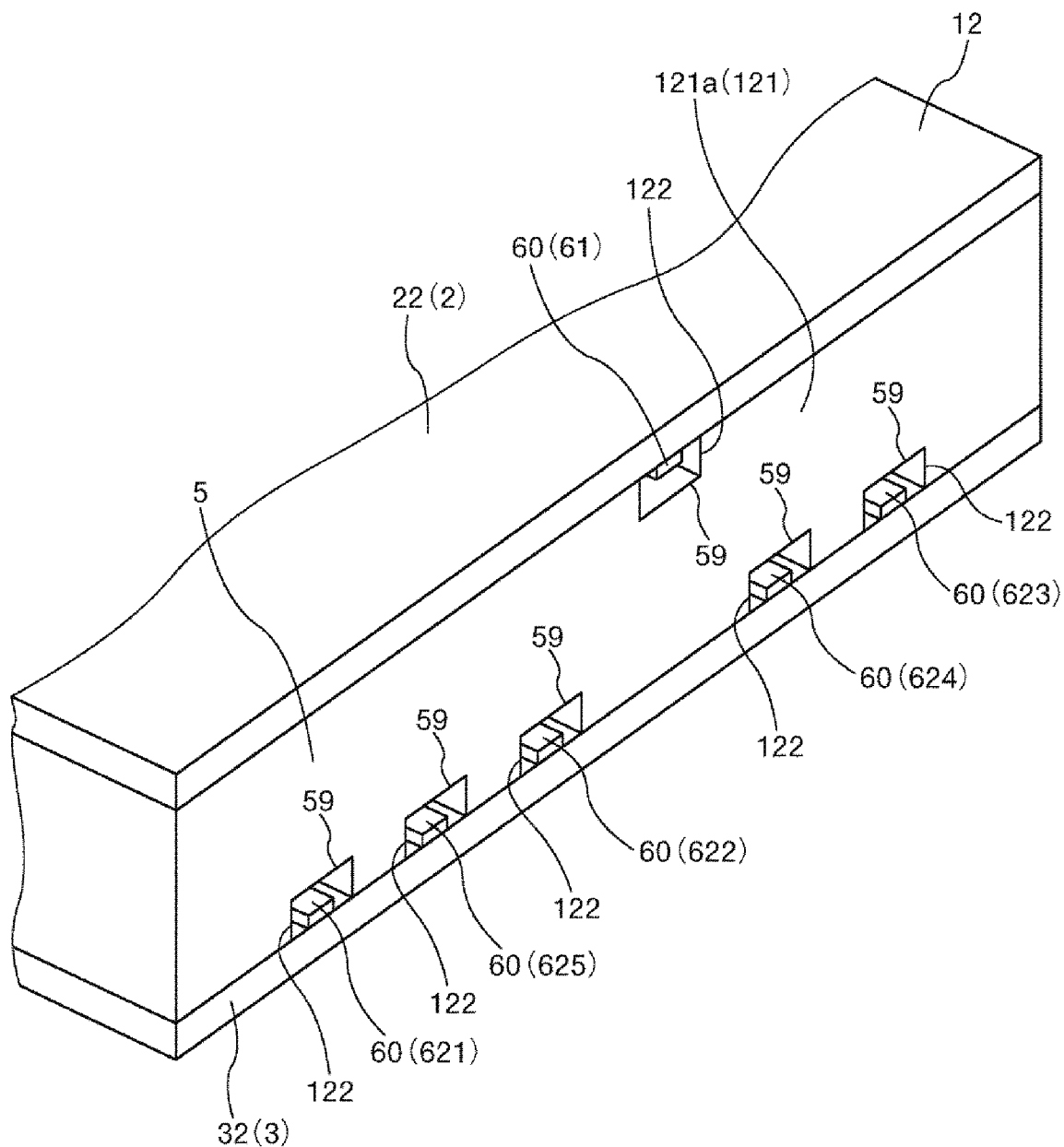
FIG. 8 is a partially enlarged perspective view of the vibrator.
Figure 9:
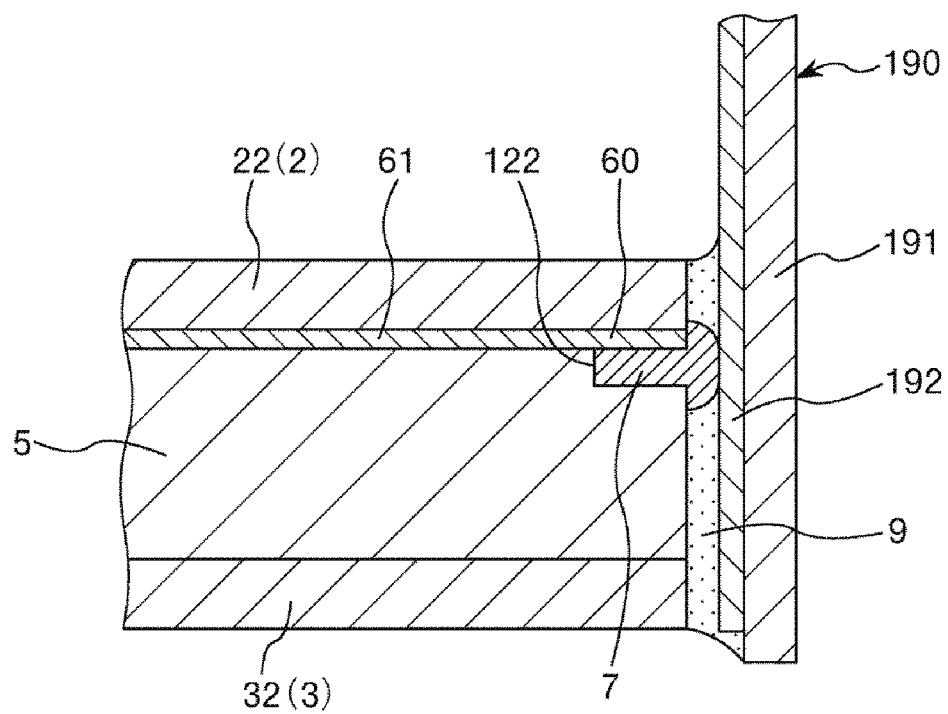
FIG. 9 is a partially enlarged sectional view of the vibrator.
Figure 10:
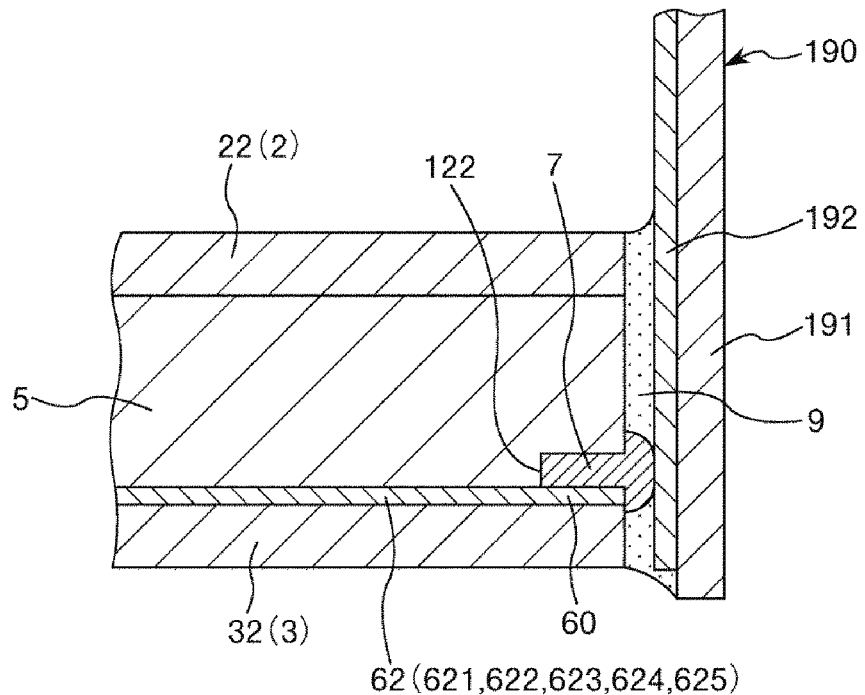
FIG. 10 is a partially enlarged sectional view of the vibrator.
Figure 11:
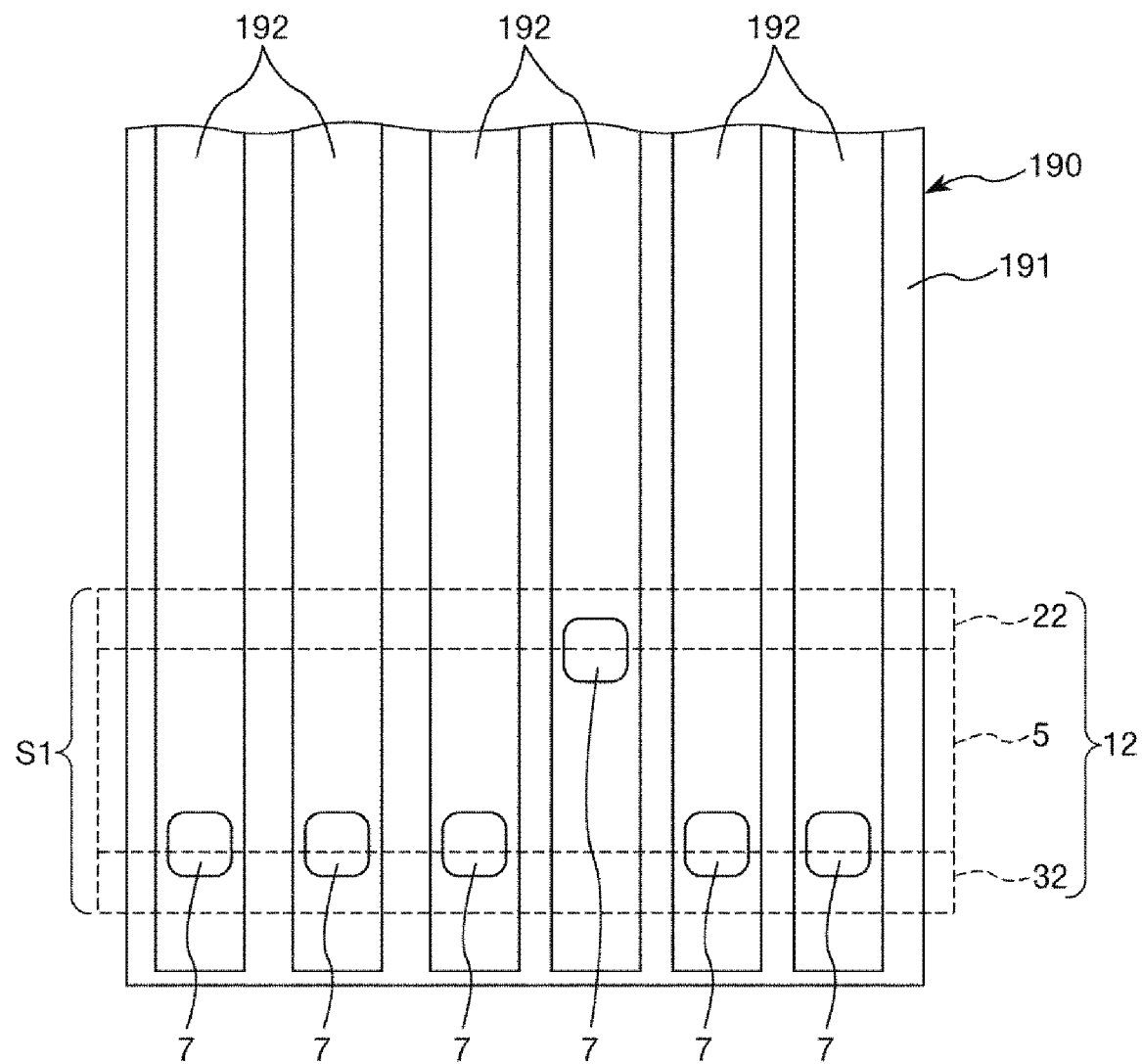
FIG. 11 is a plan view of a wiring board of the piezoelectric actuator shown in FIG. 2.
Figure 12:
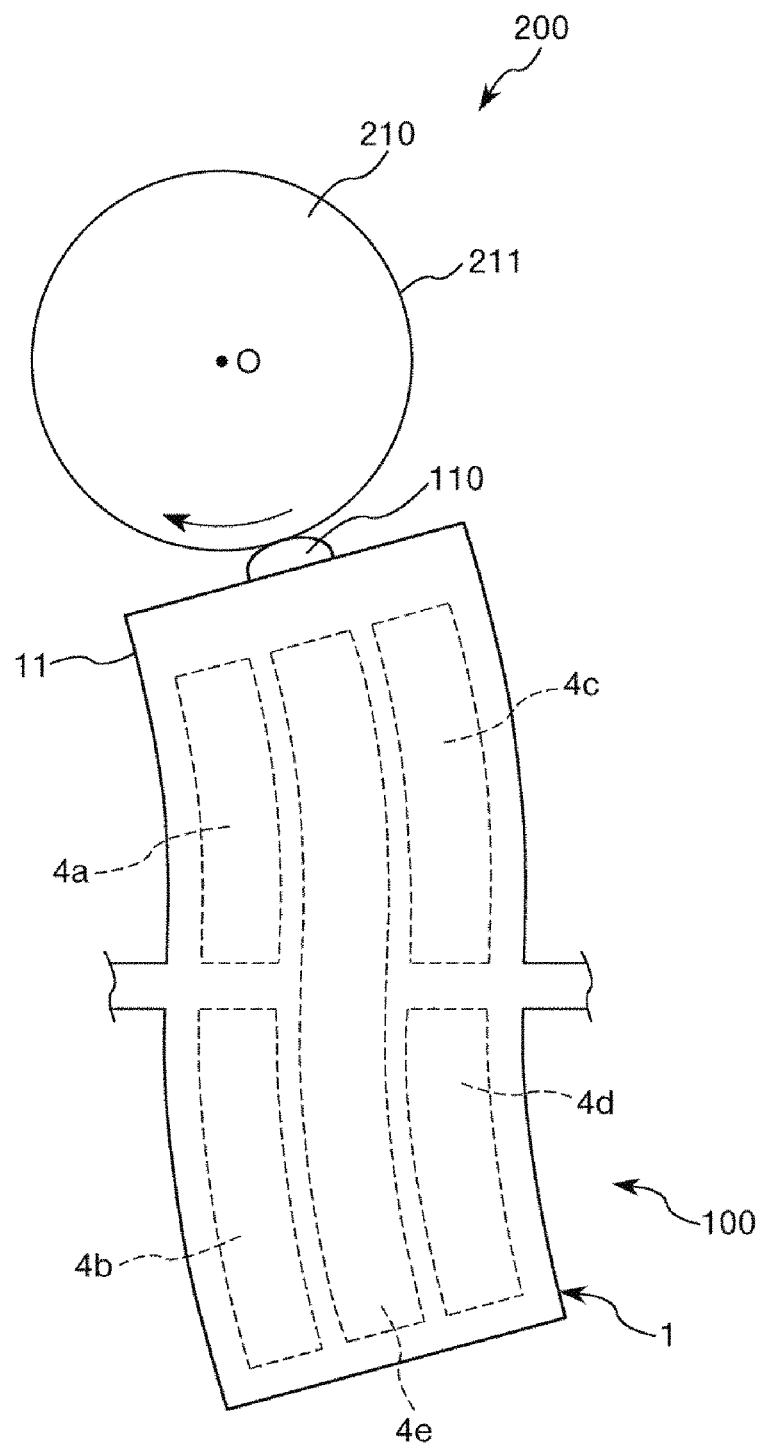
FIG. 12 is a schematic view for explanation of driving of the piezoelectric motor shown in FIG. 1.
Figure 13:
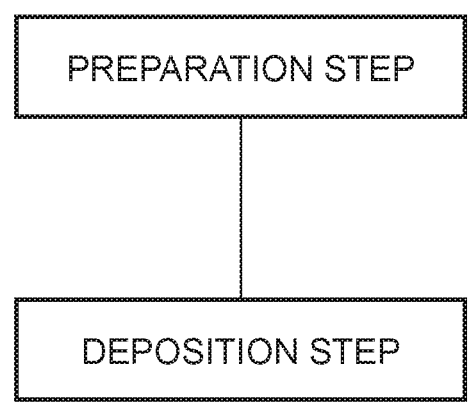
FIG. 13 is a flowchart showing a manufacturing method of the vibrator.
Figure 14:
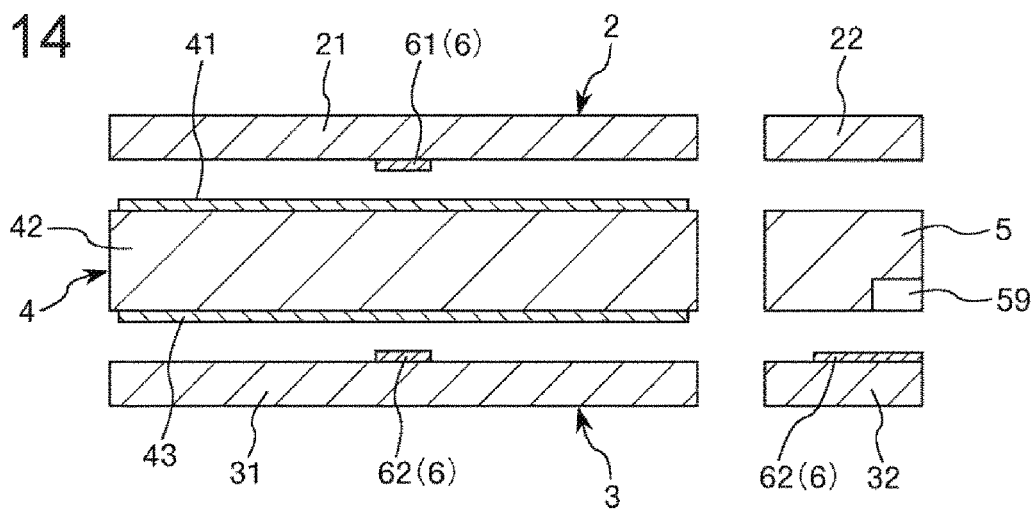
FIG. 14 is a sectional view for explanation of the manufacturing method of the vibrator.
Figure 15:
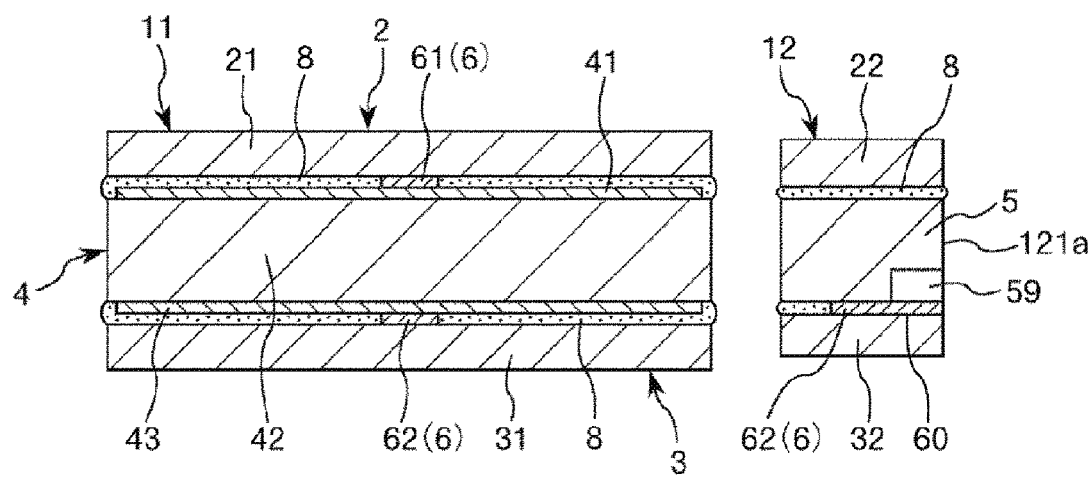
FIG. 15 is a sectional view for explanation of the manufacturing method of the vibrator.
Figure 16:
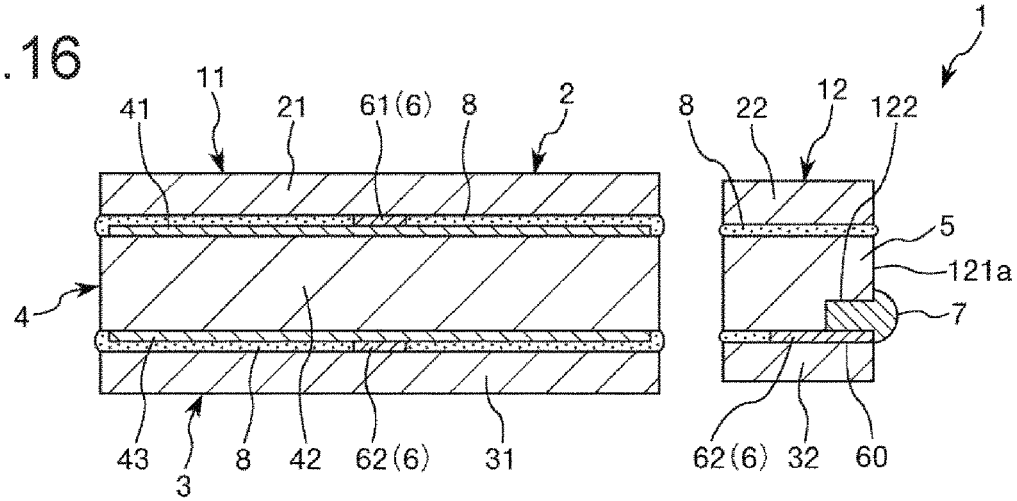
FIG. 16 is a sectional view for explanation of the manufacturing method of the vibrator.

FIG. 1 is a schematic view showing an overall configuration of the piezoelectric motor according to the first embodiment of the invention. FIG. 2 is a perspective view of a piezoelectric actuator of the piezoelectric motor shown in FIG. 1. FIG. 3A is a top view of a first substrate of a vibrator. FIG. 3B is a top view of a piezoelectric element and an interplate portion of the vibrator. FIG. 3C is a top view of a second substrate of the vibrator. FIG. 4A is a bottom view of the first substrate of the vibrator. FIG. 4B is a bottom view of the piezoelectric element and the interplate portion of the vibrator. FIG. 4C is a bottom view of the second substrate of the vibrator. FIG. 5 is a sectional view along line A-A in FIG. 1. FIG. 6 is a sectional view along line B-B in FIG. 1. FIG. 7 is a sectional view along line C-C in FIG. 1. FIG. 8 is a partially enlarged perspective view of the vibrator. FIGS. 9 and 10 are partially enlarged sectional views of the vibrator. FIG. 11 is a plan view of a wiring board of the piezoelectric actuator shown in FIG. 2. FIG. 12 is a schematic view for explanation of driving of the piezoelectric motor shown in FIG. 1. FIG. 13 is a flowchart showing a manufacturing method of the vibrator. FIGS. 14 to 16 are respectively sectional views for explanation of the manufacturing method of the vibrator. Note that, in FIG. 8, for convenience of explanation, conductor portions are not shown. Further, as below, for convenience of explanation, the upside in FIG. 2 is also referred to as "upper" and the downside is also referred to as "lower".

A piezoelectric motor 200 (ultrasonic motor) shown in FIG. 1 includes a rotor 210 as a driven part (following part) rotatable about a rotation shaft O, and a piezoelectric actuator 100 in contact with an outer circumferential surface 211 of the rotor 210. In the piezoelectric motor 200, the piezoelectric actuator 100 is driven (vibrated), and thereby, the rotor 210 may be rotated about the rotation shaft O. Note that the configuration of the piezoelectric motor 200 is not limited to the configuration in FIG. 1. For example, in the embodiment, the rotor 210 that rotationally moves is used as the driven part, however, a member that linearly moves may be used as the driven part.

The piezoelectric actuator 100 includes a vibrator 1, a convex portion 110 provided on the vibrator 1, and a wiring board 190 as a circuit component electrically connected to the vibrator 1.

As shown in FIGS. 2 to 5, the vibrator 1 includes a vibrating part 11 including a pair of vibrating plates 21, 31 and a piezoelectric material 42 provided between the pair of vibrating plates 21, 31, a supporting part 12 including a pair of supporting plates 22, 32 and an interplate portion 5 provided between the pair of supporting plates 22, 32, and a wire 6 provided in the vibrating part 11 and the supporting part 12. Further, the wire 6 is exposed from the supporting part 12. That is, the wire 6 includes an exposed portion 60 as a portion exposed from the supporting part 12. According to the vibrator 1 having the above described configuration, external electrical connection (in the embodiment, to the wiring board 190) may be made in the portion of the wire 6 exposed from the supporting part 12. Around the supporting part 12, there are not so many shielding objects that hinder the external electrical connection (to the wiring board 190), and the vibrator 1 that may easily make external electrical connection (to the wiring board 190) is obtained. As below, the vibrator 1 will be explained in detail.

The vibrator 1 includes a first substrate 2 and a second substrate 3 provided to face each other, a piezoelectric element 4 provided between these first, second substrates 2, 3, the interplate portion 5 and the wire 6, and conductor portions 7 provided in the supporting part 12. Further, the first, second substrates 2, 3 and the piezoelectric element 4 and also the first, second substrates 2, 3 and the interplate portion 5 are respectively joined via insulating adhesives 8. Note that the insulating adhesive 8 is not particularly limited, but may be various adhesives including e.g. an epoxy-based adhesive, acrylic adhesive, and silicon adhesive.

As shown in FIGS. 3A, 3B, 3C, 4A, 4B, and 4C, the first substrate 2 includes the vibrating plate 21, the supporting plate 22 that supports the vibrating plate 21, and a pair of connecting portions 23 that connect the vibrating plate 21 and the supporting plate 22. Similarly, the second substrate 3 includes the vibrating plate 31, the supporting plate 32 that supports the vibrating plate 31, and a pair of connecting portions 33 that connect the vibrating plate 31 and the supporting plate 32. The first, second substrates 2, 3 have substantially the same shape and size, and, as shown in FIGS. 5 to 7, the vibrating plates 21, 31 are provided to face each other via the piezoelectric element 4, the supporting plates 22, 32 are provided to face each other via the interplate portion 5, and the connecting portions 23, 33 are provided to face each other via an air gap S.

As described above, the first substrate 2 contains the vibrating plate 21 (one vibrating plate), the supporting plate (one supporting plate) 22, and the connecting portions 23, and thereby, these respective portions may be integrally formed from the first substrate 2 and the configuration and manufacture of the vibrator 1 are simpler. Similarly, the second substrate 3 contains the vibrating plate 31 (the other vibrating plate), the supporting plate (the other supporting plate) 32, and the connecting portions 33, and thereby, these respective portions may be integrally formed from the second substrate 3 and the configuration and manufacture of the vibrator 1 are simpler.

The first, second substrates 2, 3 are not particularly limited, but e.g. silicon substrates may be used. The silicon substrates are used as the first, second substrates 2, 3, and thereby, a silicon wafer process (MEMS process) may be used for the manufacture of the vibrator 1 and the vibrator 1 may be efficiently manufactured. Further, insulating layers (not shown) are provided on the surfaces of the first, second substrates 2, 3. For example, when the silicon substrates are used as the first, second substrates 2, 3, the insulating layers may be formed using silicon oxide formed by thermal oxidation of the surfaces of the silicon substrates.

As shown in FIG. 1, the vibrating part 11 has a nearly rectangular shape (longitudinal shape) in a plan view as seen from the thickness direction of the vibrator 1 (in a direction in which the first, second substrates 2, 3 overlap). The convex portion 110 is provided in the tip end part of the vibrating part 11 in the longitudinal direction and in the center part in the width direction (lateral direction). A convex portion 110 protrudes from the vibrating part 11 toward the tip end side and the tip end surface is in contact with the outer circumferential surface 211 of the rotor 210. Accordingly, when the vibrating part 11 vibrates, the vibration is transmitted to the rotor 210 via the convex portion 110, and the rotor 210 rotates about the rotation shaft O. As described above, the convex portion 110 is provided, and thereby, the vibration of the vibrating part 11 may be efficiently transmitted to the rotor 210. Further, the contact between the vibrating part 11 and the rotor 210 may be suppressed and the possibility of breakage of the vibrating part 11 may be reduced.

Note that the shapes and placements of the vibrating part 11 and the convex portion 110 are not particularly limited as long as they may exert the functions thereof.

As shown in FIG. 2, the vibrating part 11 includes the vibrating plates 21, 31 and the piezoelectric element 4 sandwiched between these vibrating plates 21, 31. Further, as shown in FIG. 1, the piezoelectric element 4 includes five piezoelectric elements 4a, 4b, 4c, 4d, 4e. The piezoelectric element 4e is provided along the longitudinal direction of the vibrating part 11 in the center part in the width direction of the vibrating part 11. With respect to the piezoelectric element 4e, on one side in the width direction of the vibrating part 11, the piezoelectric elements 4a, 4b are provided along the longitudinal direction of the vibrating part 11 and, on the other side, the piezoelectric elements 4c, 4d are provided along the longitudinal direction of the vibrating part 11.

As shown in FIGS. 5 to 7, each of the five piezoelectric elements 4a, 4b, 4c, 4d, 4e includes the piezoelectric material 42, a first electrode 41 provided on one principal surface (the principal surface on the vibrating plate 21 side) of the piezoelectric material 42, and a second electrode 43 provided on the other principal surface (the principal surface on the vibrating plate 31 side) of the piezoelectric material 42.

The first electrode 41 is a common electrode provided in common with the piezoelectric elements 4a, 4b, 4c, 4d, 4e. On the other hand, the second electrodes 43 are individual electrodes individually provided with respect to each of the piezoelectric elements 4a, 4b, 4c, 4d, 4e. Further, the piezoelectric material 42 is integrally provided in common with the piezoelectric elements 4a, 4b, 4c, 4d, 4e. Note that the piezoelectric material 42 may be individually provided with respect to each of the piezoelectric elements 4a, 4b, 4c, 4d, 4e. Or, contrary to the embodiment, the first electrodes 41 may be individually provided with respect to each of the piezoelectric elements 4a, 4b, 4c, 4d, 4e and the second electrode 43 may be provided in common with the piezoelectric elements 4a, 4b, 4c, 4d, 4e.

The constituent materials of the first, second electrodes 41, 43 are not particularly limited, but e.g. a metal material such as aluminum (Al), nickel (Ni), gold (Au), platinum (Pt), iridium (Ir), or copper (Cu) is used. The first, second electrodes 41, 43 may be formed by evaporation, sputtering, or the like.

The piezoelectric material 42 expands and contracts in directions along the longitudinal direction of the vibrating part 11 by application of an electric field in the directions along the thickness direction of the vibrating part 11. As the constituent material of the piezoelectric material 42, e.g. piezoelectric ceramics such as lead zirconate titanate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, or lead scandium niobate may be used. The piezoelectric material 42 of the piezoelectric ceramics may be formed from a balk material or formed using a sol-gel method or sputtering, for example. It is preferable that the piezoelectric material is formed from a balk material. Thereby, the manufacture of the vibrator 1 is easier. As the constituent material of the piezoelectric material 42, polyvinylidene fluoride, quartz crystal, or the like may be used in addition to the above described piezoelectric ceramics.

As shown in FIG. 1, the supporting part 12 has a U-shape surrounding the base end side of the vibrating part 11. Note that the shape and the placement of the supporting part 12 are not particularly limited as long as the part may exert the function thereof. For example, the supporting part 12 may be divided in two on one side and the other side in the width direction of the vibrating part 11.

Further, as shown in FIG. 2, the supporting part 12 includes the supporting plates 22, 32 and the interplate portion 5 sandwiched between the supporting plates 22, 32. As shown in FIGS. 3A, 3B, 3C, 4A, 4B, and 4C, the interplate portion 5 has substantially the same shape and size as the supporting plates 22, 32 in the plan view as seen from the direction in which the supporting plates 22, 32 overlap. The interplate portion 5 is provided, and thereby, the supporting part 12 may be made to be sufficiently thick and the side surface having a sufficient width may be formed in the supporting part 12. Accordingly, the exposed portion 60 of the wire 6 is easily exposed from the side surface of the supporting part 12.

The interplate portion 5 has an insulation property in the direction in which the pair of supporting plates 22, 32 overlap. Thereby, the wire 6 is easily provided on the supporting part 12. Specifically, as will be described later, the wire 6 includes a first wire 61 and a plurality of second wires 621, 622, 623, 624, 625, and thereby, when the interplate portion 5 has the insulation property, short circuit of the wires 621, 622, 623, 624, 625 may be effectively suppressed. Note that "having an insulation property" refers to having an electrical resistance with a sufficient magnitude for preventing short circuit of the wires 621, 622, 623, 624, 625.

The interplate portion 5 is not particularly limited, but e.g. various ceramics such as zirconia, alumina, and titania, various metal materials, silicon, various resin materials, etc. may be used. Among them, various ceramics, various metal materials, silicon are preferably used, and thereby, the hard interplate portion 5 is obtained. Note that, when a metal material is used, in order to provide an insulation property to the interplate portion 5, it is necessary to perform processing including insulation treatment on the surface thereof or the like. Or, silicon is used, and thereby, the interplate portion 5 may be provided using a silicon wafer process and the vibrator 1 may be efficiently manufactured.

Note that, in the embodiment, the interplate portion 5 has a single layer, however, the interplate portion 5 may have a configuration in which a plurality of layers are stacked in the thickness direction of the vibrator 1. Further, in the embodiment, the interplate portion 5 is formed by a single block, however, the interplate portion 5 may be divided in a plurality of blocks.

The thickness of the interplate portion 5 in the direction in which the first substrate 2 and the second substrate 3 overlap (hereinafter, also referred to as "thickness direction") is smaller than that of the piezoelectric material 42. That is, a thickness $T_5$ of the interplate portion 5 and a thickness $T_{42}$ of the piezoelectric material 42 satisfies a relationship of $T_5 < T_{42}$. The relationship is satisfied, and thereby, the manufacture of the vibrator 1 is easier and the yield is improved. As will be described later in a manufacturing method, the vibrator 1 is manufactured by sandwiching of the piezoelectric element 4 and the interplate portion 5 between the first substrate 2 and the second substrate 3 and pressing and joining of them. Here, if a relationship of $T_5 > T_{42}$ is satisfied contrary to the embodiment, the first, second substrates 2, 3 and the interplate portion 5 are joined preferentially over the first, second substrates 2, 3 and the piezoelectric element 4 because the thickness of the interplate portion 5 is larger than the thickness of the piezoelectric material 42 and, depending on the apparatus used for joining, a joining condition, or the like, it may be impossible to provide a sufficiently high joining strength between the first, second substrates 2, 3 and the piezoelectric element 4. If the joining strength between the first, second substrates 2, 3 and the piezoelectric element 4 is not sufficient, it is highly likely to cause defective driving and failure of the vibrating part 11. Accordingly, as in the embodiment, the relationship of $T_5 < T_{42}$ is satisfied, and thereby, the first, second substrates 2, 3 and the piezoelectric element 4 are joined preferentially over the first, second substrates 2, 3 and the interplate portion 5, and a sufficiently high joining strength may be provided between the first, second substrates 2, 3 and the piezoelectric element 4 and the first, second substrates 2, 3 and the piezoelectric element 4 may be bonded more reliably. Therefore, the likeliness of defective driving and failure of the vibrating part 11 is lower. Note that, in the invention, satisfaction of the relationship of $T_5 \geq T_{42}$ is not excluded and, for example, in the case where a sufficiently high joining strength may be provided between the first, second substrates 2, 3 and the piezoelectric element 4 or the like, the relationship of $T_5 \geq T_{42}$ may be satisfied.

Particularly, regarding the thickness $T_5$ of the interplate portion 5 and the thickness $T_{42}$ of the piezoelectric material 42, it is preferable that the relationship of $0.8\,T_{42} \leq T_5 < T_{42}$ is satisfied and more preferable that the relationship of $0.9\,T_{42} \leq T_5 < T_{42}$ is satisfied. For example, when the thickness $T_{42}$ of the piezoelectric material 42 is 200 µm, it is preferable that the thickness $T_5$ of the interplate portion 5 is thinner than $T_{42}$ by about 20 to 40 µm. The relationship is satisfied, and thereby, significant reduction of the joining strength between the first, second substrates 2, 3 and the interplate portion 5 may be effectively suppressed. That is, the first, second substrates 2, 3 and the piezoelectric material 42 and the first, second substrates 2, 3 and the interplate portion 5 may be respectively joined with sufficient strengths.

Further, it is more preferable that the flatness of the first substrate 2 and the second substrate 3 is respectively higher. Furthermore, it is more preferable that the parallelism of the first substrate 2 and the second substrate 3 is respectively higher. Thereby, for example, as will be described in the second embodiment, when the piezoelectric actuator 100 has a configuration in which a plurality of vibrators 1 are stacked, the plurality of vibrators 1 may be stacked with higher accuracy. Note that, as described above, the relationship of $T_5<T_{42}$ is satisfied in the embodiment, and it is slightly likely that the first substrate 2 is curved to be convex outward and the second substrate 3 is curved to be convex outward. Accordingly, for example, a gap material including a softer resin material or the like (a material having a smaller Young's modulus than the interplate portion 5) is provided between the supporting plates 22, 32 and the interplate portion 5 to increase the thickness of the supporting part 12, and thereby, the flatness and parallelism of the first, second substrates 2, 3 may be improved. Note that the soft material is used as the gap material, and thereby, the effect by the satisfaction of the above described relationship of $T_5<T_{42}$ may be still exerted.

As shown in FIGS. 3A, 3B, 3C, 4A, 4B, and 4C, the wire 6 includes the first wire 61 provided on the first substrate 2 and a second wire 62 provided on the second substrate 3. The first wire 61 is provided on the inner surface of the first substrate 2 and located between the first substrate 2 and the piezoelectric element 4 and interplate portion 5. On the other hand, the second wire 62 is provided on the inner surface of the second substrate 3 and located between the second substrate 3 and the piezoelectric element 4 and interplate portion 5. As described above, the first wire 61 is provided on one side of the piezoelectric element 4 and the interplate portion 5 and the second wire 62 is provided on the other side, and thereby, short circuit between the first wire 61 and the second wire 62 may be prevented and the degree of freedom of the placement of the first wire 61 and the second wire 62 may be improved.

The first wire 61 is provided on the inner surface of the first substrate 2 via the connecting portions 23 over the vibrating plate 21 and the supporting plate 22. Further, one end of the first wire 61 is connected to the first electrode 41 and the other end is exposed from the side surface of the supporting part 12 and forms the exposed portion 60 as shown in FIG. 8.

On the other hand, the second wire 62 includes the plurality of second wires 621, 622, 623, 624, 625. The second wires 621, 622, 623, 624, 625 are respectively provided on the inner surface of the second substrate 3 via the connecting portions 33 over the vibrating plate 31 and the supporting plate 32. Further, one ends of the second wires 621, 622, 623, 624, 625 are connected to the second electrodes 43 individually provided with respect to each of the piezoelectric elements 4a, 4b, 4c, 4d, 4e, and the other ends are exposed from the side surface of the supporting part 12 and form the exposed portions 60 as shown in FIG. 8.

The exposed portions 60 of the respective wires 61, 621, 622, 623, 624, 625 function as connecting portions for electrical connection between the vibrator 1 and the wiring board 190. The positions of the exposed portions 60 are not particularly limited, however, it is preferable that the positions are in an outer circumferential surface 121 of the supporting part 12 (of the side surfaces, the surface facing the opposite side to the vibrating part 11). In other words, it is preferable that the positions are in a part except the inner circumferential surface opposed to the vibrating part 11 of the side surfaces of the supporting part 12. The outer circumferential surface 121 is not opposed to the vibrating part 11 and a sufficient space exists around the surface. Accordingly, the exposed portions 60 are provided in the outer circumferential surface 121, and thereby, the vibrator 1 and the wiring board 190 may be easily electrically connected via the exposed portions 60. Note that it is preferable that the exposed portions 60 are located in a surface 121a located on the base end side with respect to the vibrating part 11 of the outer circumferential surface 121, particularly as in the embodiment. Thereby, the electrical connection between the vibrator 1 and the wiring board 190 may be more easily made and the placement balance of the vibrator 1 and the wiring board 190 is better.

Further, the exposed portions 60 of the respective wires 61, 621, 622, 623, 624, 625 are provided at intervals in the width direction of the supporting part 12 in a plan view as seen from the normal direction of the surface 121a. Accordingly, the respective exposed portions 60 are provided without overlap in the thickness direction of the supporting part 12 in the plan view as seen from the normal direction of the surface 121a. The respective exposed portions 60 are thus provided, and thereby, as will be described later, the electrical connection between the vibrator 1 and the wiring board 190 may be easily made.

Here, as shown in FIG. 8, the supporting part 12 includes concave portions 122 opening to the surface (outer circumferential surface 121), and the exposed portions 60 of the respective wires 61, 621, 622, 623, 624, 625 are located within the concave portions 122. That is, the respective wires 61, 621, 622, 623, 624, 625 are exposed within the concave portions 122. Thereby, the exposed portions 60 may be easily exposed from the supporting part 12 and the exposed portions 60 may be made larger. Accordingly, the electrical connection between the vibrator 1 and the wiring board 190 may be made more easily and more reliably. Note that the concave portions 122 may be omitted and, in this case, the end surfaces of the respective wires 61, 621, 622, 623, 624, 625 form the exposed portions 60. Further, in the embodiment, the concave portions 122 are formed by grooves 59 formed in the interplate portion 5, however, the concave portions 122 may be formed in the first substrate 2 or second substrate 3 or formed over the first substrate 2 or second substrate 3 and the interplate portion 5.

As shown in FIGS. 9 and 10, the conductor portions 7 in contact with the exposed portions 60 of the respective wires 61, 621, 622, 623, 624, 625 are provided in the concave portions 122. The conductor portions 7 are provided, and thereby, the terminal on the vibrator 1 side may be made larger and the electrical connection between the vibrator 1 and the wiring board 190 may be made more easily and more reliably. Particularly, in the embodiment, the conductor portions 7 are provided to fill the concave portions 122 and protrude from the outer circumferential surface 121 of the supporting part 12. Thereby, the conductor portions 7 may be easily brought into contact with the wiring board 190 and the electrical connection between the vibrator 1 and the wiring board 190 may be made more easily and more reliably.

The constituent material of the conductor portions 7 is not particularly limited, but e.g. a metal material such as aluminum (Al), nickel (Ni), gold (Au), platinum (Pt), or copper (Cu) is used. Further, the formation method of the conductor portions 7 is not particularly limited, but e.g. evaporation, sputtering, plating, or the like may be used. Note that, among them, it is preferable to deposit the conductor portions 7 by plating (particularly, non-electrolytic plating). Thereby, the conductor portions 7 may be formed more easily.

Next, the wiring board 190 is explained. The wiring board 190 is e.g. a printed wiring board and, as shown in FIG. 2, includes a board 191 and a plurality of wires 192 provided on the board 191. Note that the board 191 may be a flexible board having flexibility or hard rigid board.

The wiring board 190 is joined to the vibrator 1 in the supporting part 12 and the respective wires 192 are electrically connected to the corresponding wires 61, 621, 622, 623, 624, 625 via the conductor portions 7. The supporting part 12 and the wiring board 190 may be joined via e.g. an insulating adhesive 9. The wiring board 190 is provided, and thereby, the respective wires 61, 621, 622, 623, 624, 625 of the vibrator 1 may be easily led to the outside of the vibrator 1. Note that, as described above, the conductor portions 7 protrude, and thereby, the conductor portions 7 and the wires 192 are brought into contact more reliably.

Further, as shown in FIG. 11, the plurality of wires 192 are provided side by side in the width direction of the vibrator 1 and extend along the thickness direction of the vibrator 1 in an area S1 overlapping with at least the vibrator 1. As described above, the exposed portions 60 of the wires 61, 621, 622, 623, 624, 625 are provided at intervals in the width direction of the supporting part 12 and the plurality of wires 192 are provided as above, and thereby, the respective wires 192 may be prevented from being in contact with the two or more exposed portions 60 with the wiring board 190 and the vibrator 1 joined and short circuit may be effectively suppressed.

Next, an example of operation of the piezoelectric motor 200 is explained. Note that the operation method of the piezoelectric motor 200 is not limited to the following method. When drive signals at predetermined frequencies (alternating voltages) are applied to the respective piezoelectric elements 4a, 4b, 4c, 4d, 4e so that the phase difference between the piezoelectric elements 4a, 4d and the piezoelectric elements 4b, 4c may be 180° and the phase difference between the piezoelectric elements 4a, 4d and the piezoelectric element 4e may be 30°, as shown in FIG. 12, the piezoelectric elements 4a, 4b, 4c, 4d, 4e respectively expand and contract and the vibrating part 11 flexurally deforms in an S-shape (expansively and contrastively deforms in the longitudinal directions and flexurally deforms in the width directions), and thereby, the tip end of the convex portion 110 makes an elliptic motion. As a result, the rotor 210 rotates in an arrow direction about the rotation shaft O. In this regard, the drive signal is applied to the piezoelectric element 4e so that the phase difference from the piezoelectric elements 4a, 4d may be 210°, and thereby, the rotor 210 may be reversely rotated.

As above, the vibrator 1, and the piezoelectric actuator 100 and the piezoelectric motor 200 including the vibrators 1 are explained in detail. The piezoelectric actuator 100 and the piezoelectric motor 200 include the vibrators 1, and thereby, may enjoy the above described advantages of the vibrator 1 and may exert good reliability.

Next, a manufacturing method of the piezoelectric actuator will be explained. As shown in FIG. 13, the manufacturing method of the vibrator 1 includes a preparation step and a deposition step. The preparation step is a step of preparing the vibrator 1 including the vibrating part 11 including the pair of vibrating plates 21, 31 and the piezoelectric material 42 provided between the pair of vibrating plates 21, 31, the supporting part 12 including the pair of supporting plates 22, 32 and the interplate portion 5 provided between the pair of supporting plates 22, 32, and the wire 6 provided between the vibrating part 11 and the supporting part 12 and including the exposed portions 60 exposed from the supporting part 12 to the outside. Further, the deposition step is a step of forming the conductor portions 7 in contact with the exposed portions 60 by plating. As below, the manufacturing method will be explained in detail.

Preparation Step

First, as shown in FIG. 14, the first substrate 2 with the first wire 61 provided thereon, the second substrate 3 with the second wire 62 provided thereon, the piezoelectric element 4, and the interplate portion 5 are prepared. Then, as shown in FIG. 15, they are joined via the insulating adhesive 8 (not shown).

Deposition Step

Then, as shown in FIG. 16, the conductor portions 7 in contact with the exposed portions 60 of the wire 6 (61, 621, 622, 623, 624, 625) are deposited by plating (specifically, non-electrolytic plating). The conductor portions 7 are formed to fill the concave portions 122, and further, parts thereof protrude from the openings of the concave portions 122 to the outside of the supporting part 12.

In the above described manner, the vibrator 1 is obtained. According to the manufacturing method, the vibrator 1 that may easily make electrical connection to the wiring board 190 may be provided.

Second Embodiment

Next, a piezoelectric actuator according to the second embodiment of the invention will be explained.

Figure 17:
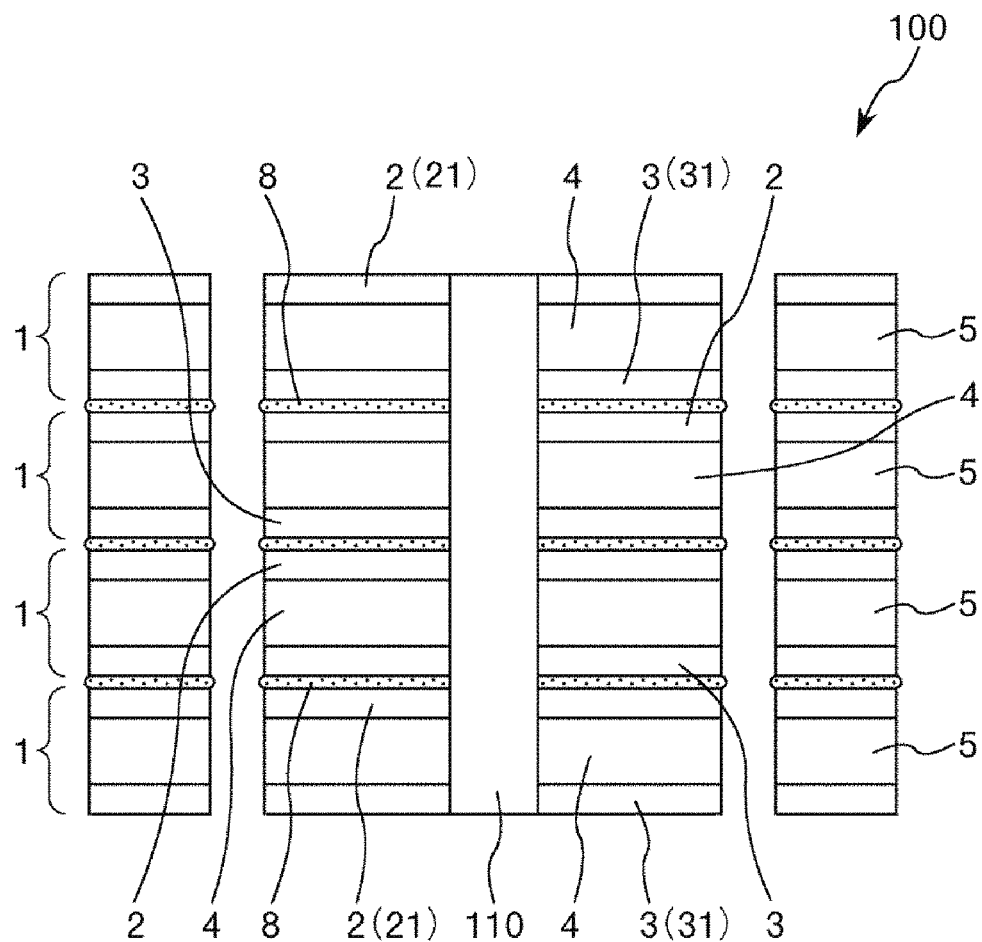
FIG. 17 is a side view of a piezoelectric actuator according to the second embodiment of the invention.

FIG. 17 is a side view of the piezoelectric actuator according to the second embodiment of the invention.

The embodiment is the same as the above described first embodiment except that a plurality of vibrators are stacked.

Note that, in the following explanation, the embodiment will be explained with a focus on the differences from the above described embodiment and the explanation of the same items will be omitted. Further, in FIG. 17, the same configurations as those of the above described embodiment have the same signs.

As shown in FIG. 17, the piezoelectric actuator 100 of the embodiment includes a plurality of vibrators 1, and the plurality of vibrators 1 are stacked in the thickness direction of the vibrators 1 (in the direction in which the first, second substrates 2, 3 overlap). Further, the respective vibrators 1 are stacked in the same orientation with the first substrates 2 on the upside and the second substrates 3 on the downside. Further, the two overlapping vibrators 1 are joined by e.g. the adhesive 8. According to the configuration, for example, compared to the above described first embodiment, the drive force of the piezoelectric actuator 100 may be made higher.

Note that the number of stacked vibrators 1 is not particularly limited, but may be appropriately set depending on the placement space of the piezoelectric actuator 100, the drive force required for the piezoelectric actuator 100, or the like. Further, in the embodiment, in the two overlapping vibrators 1, the first substrate 2 of one vibrator 1 and the second substrate 3 of the other vibrator 1 are provided to overlap, however, for example, the first substrate 2 of one vibrator 1 and the second substrate 3 of the other vibrator 1 may be formed by a single substrate.

According to the second embodiment, the same advantages as those of the above described first embodiment may be exerted.

Third Embodiment

Next, a piezoelectric actuator according to the third embodiment of the invention will be explained.

Figure 18:
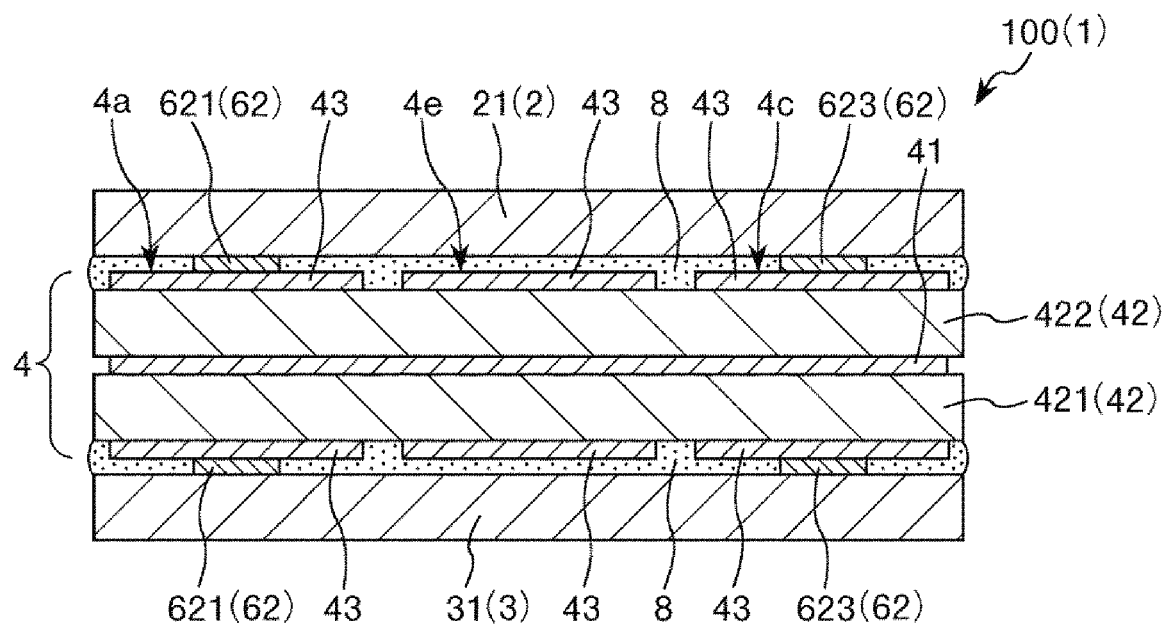
FIG. 18 is a sectional view of a vibrator according to the third embodiment of the invention.
Figure 19:
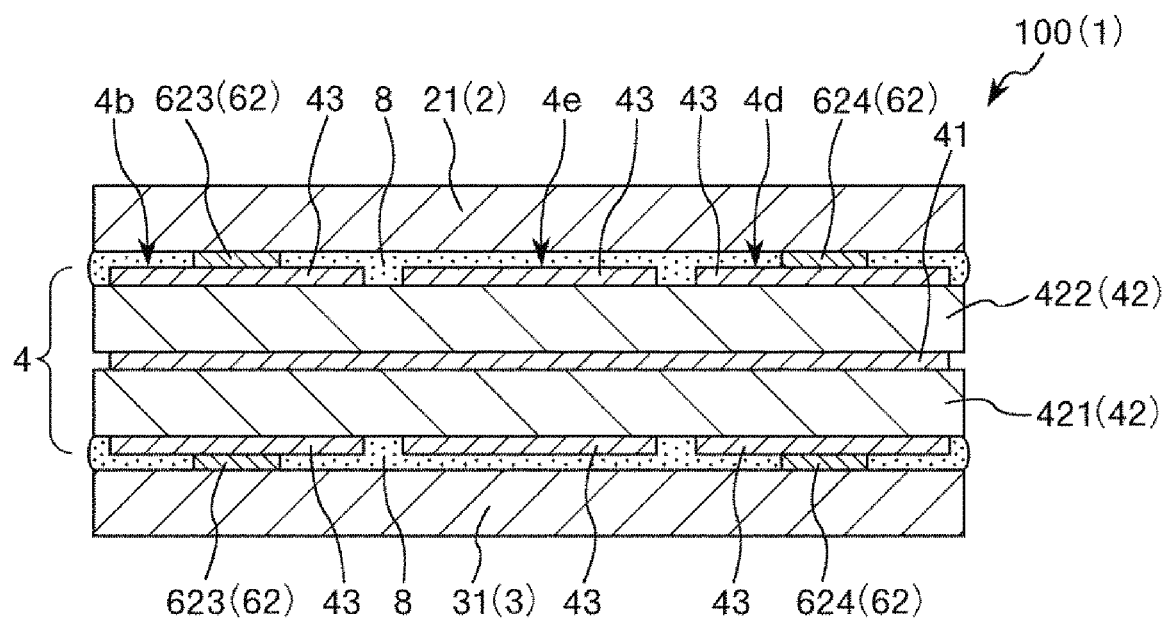
FIG. 19 is a sectional view of the vibrator according to the third embodiment of the invention.
Figure 20:
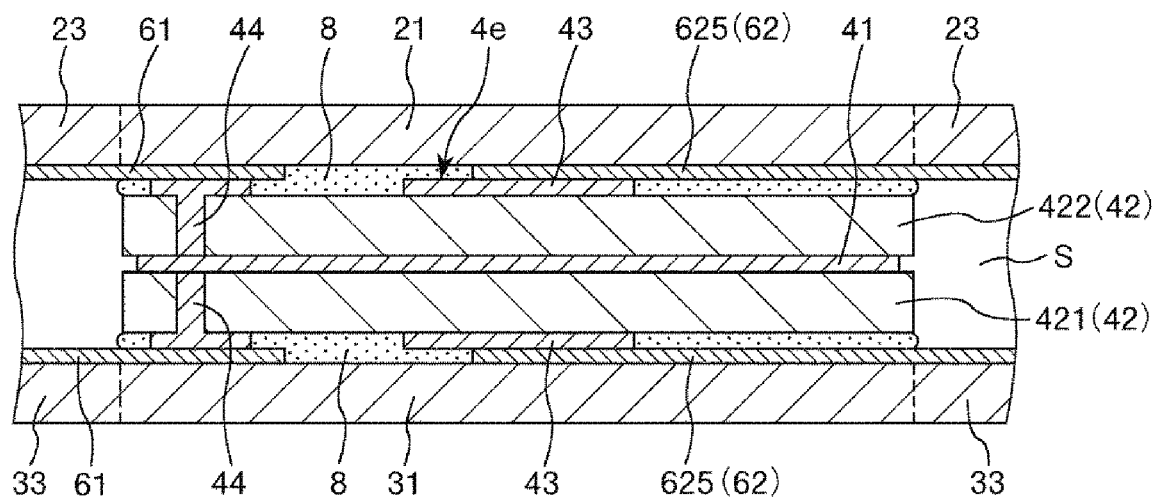
FIG. 20 is a sectional view of the vibrator according to the third embodiment of the invention.
Figure 21:
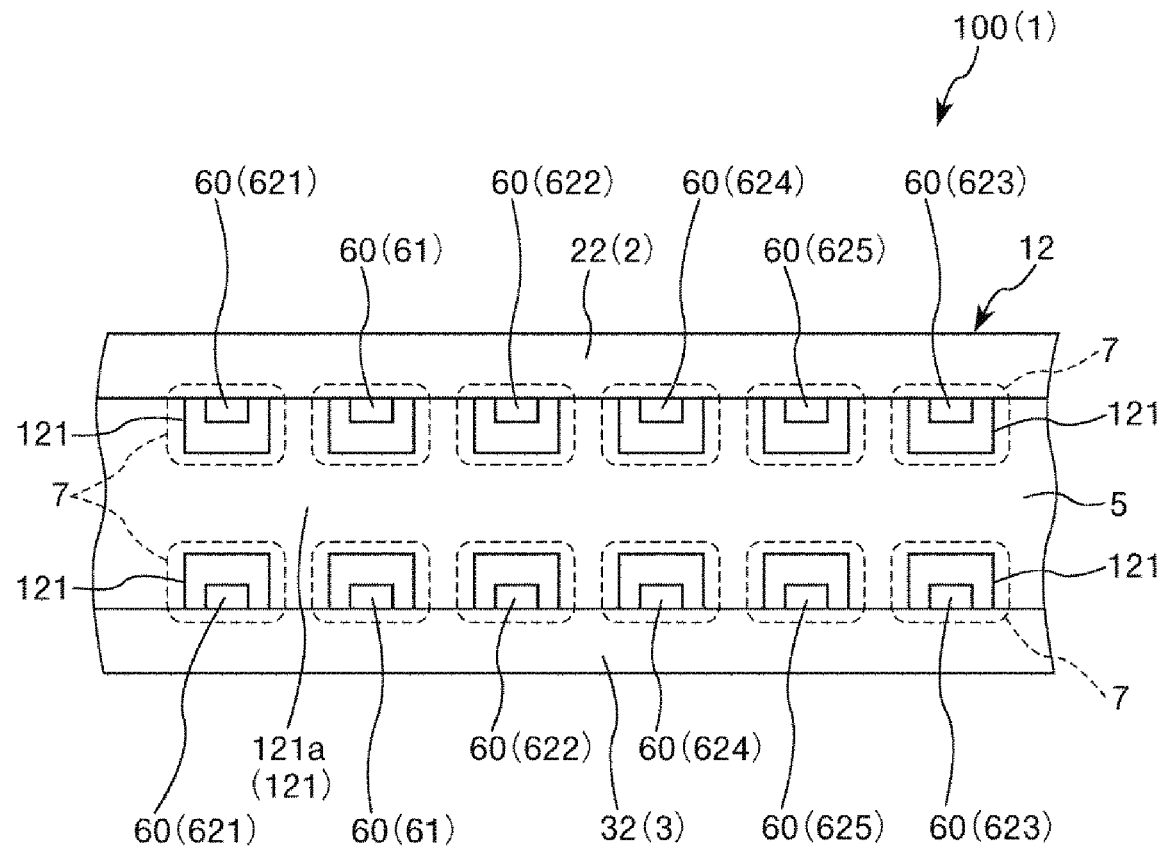
FIG. 21 is a side view of the vibrator shown in FIG. 18.

FIGS. 18 to 20 are respectively sectional views of the vibrator according to the third embodiment of the invention. FIG. 21 is a side view of the vibrator shown in FIG. 18. Note that FIG. 18 corresponds to a sectional view along line A-A in FIG. 1, FIG. 19 corresponds to a sectional view along line B-B in FIG. 1, and FIG. 20 corresponds to a sectional view along line C-C in FIG. 1.

The embodiment is the same as the above described first embodiment except that the configuration of the vibrating part is different.

Note that, in the following explanation, the embodiment will be explained with a focus on the differences from the above described embodiments and the explanation of the same items will be omitted. Further, in FIG. 18, the same configurations as those of the above described embodiments have the same signs.

As shown in FIGS. 18 to 20, the piezoelectric actuator 100 (vibrator 1) of the embodiment includes a plurality of piezoelectric materials 42 stacked along the direction in which the pair of vibrating plates 21, 31 overlap between the pair of vibrating plates 21, 31. Specifically, the piezoelectric element 4 includes the piezoelectric material 42 including two stacked piezoelectric materials 421, 422, the first electrode 41 provided between the piezoelectric materials 421, 422, and the second electrodes 43 provided on the lower surface of the piezoelectric element 421 and the upper surface of the piezoelectric element 422. The first electrode is the common electrode provided in common with the piezoelectric elements 4a, 4b, 4c, 4d, 4e, and the second electrodes 43 are individual electrodes individually provided with respect to each of the piezoelectric elements 4a, 4b, 4c, 4d, 4e.

Further, the wires 61, 621, 622, 623, 624, 625 are provided on the inner surface of the first substrate 2. The wire 61 is electrically connected to the first electrode 41 via a via hole 44 (through electrode) formed in the piezoelectric element 422, and the wires 621, 622, 623, 624, 625 are electrically connected to the second electrodes 43 individually provided with respect to each of the piezoelectric elements 4a, 4b, 4c, 4d, 4e.

Similarly, the wires 61, 621, 622, 623, 624, 625 are provided on the inner surface of the second substrate 3. The wire 61 is electrically connected to the first electrode 41 via a via hole 44 (through electrode) formed in the piezoelectric element 421, and the wires 621, 622, 623, 624, 625 are electrically connected to the second electrodes 43 individually provided with respect to each of the piezoelectric elements 4a, 4b, 4c, 4d, 4e.

According to the piezoelectric actuator 100 (vibrator 1) having the above described configuration, the following advantages may be exerted. For example, compared to the piezoelectric element 4 including the single-layer piezoelectric material 42 as in the above described first embodiment, when the thicknesses of the piezoelectric elements 4 are the same, the thickness of the single piezoelectric material 42 may be thinner in the embodiment. Accordingly, the field efficiency for the piezoelectric material 42 is higher and the vibrator 1 may exert the stronger drive power. Further, when the thicknesses of the single piezoelectric materials 42 are the same, the vibrator 1 may exert the stronger drive power because of the larger number of piezoelectric materials 42 in the embodiment.

Note that the wires 61, 621, 622, 623, 624, 625 on the first substrate 2 and the wires 61, 621, 622, 623, 624, 625 on the second substrate 3 are symmetrically provided and, as shown in FIG. 21, the exposed portions 60 of the corresponding wires are provided to overlap in the thickness direction of the vibrator 1. Accordingly, the corresponding exposed portions 60 may be easily connected by the wires 192 of the wiring board 190.

According to the third embodiment, the same advantages as those of the above described first embodiment may be exerted.

Fourth Embodiment

Next, a robot according to the fourth embodiment of the invention will be explained.

Figure 22:
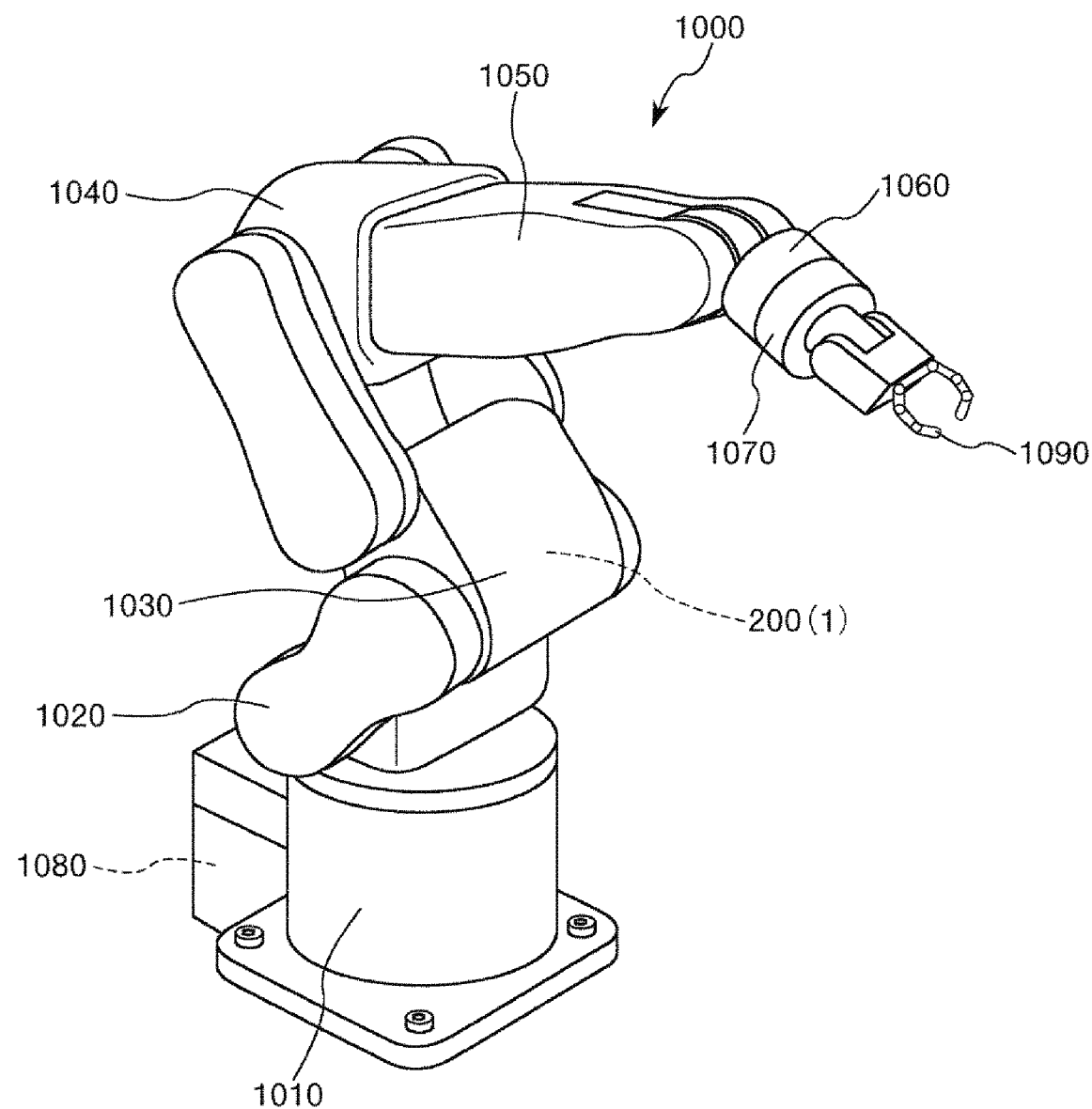
FIG. 22 is a perspective view of a robot according to the fourth embodiment of the invention.

FIG. 22 is a perspective view of the robot according to the fourth embodiment of the invention.

The robot 1000 shown in FIG. 22 may perform work of feeding, removing, carrying, assembly, etc. of precision apparatuses and components forming the apparatuses (objects). The robot 1000 is a six-axis robot, and includes a base 1010 fixed to a floor or ceiling, an arm 1020 rotatably coupled to the base 1010, an arm 1030 rotatably coupled to the arm 1020, an arm 1040 rotatably coupled to the arm 1030, an arm 1050 rotatably coupled to the arm 1040, an arm 1060 rotatably coupled to the arm 1050, an arm 1070 rotatably coupled to the arm 1060, and a control unit 1080 that controls driving of these arms 1020, 1030, 1040, 1050, 1060, 1070. Further, a hand connecting part is provided in the arm 1070, and an end effector 1090 according to work to be executed by the robot 1000 is attached to the hand connecting part. Piezoelectric motors 200 are mounted on all or part of the respective joint parts, and the respective arms 1020, 1030, 1040, 1050, 1060, 1070 rotate by driving of the piezoelectric motors 200. Note that the driving of the respective piezoelectric motors 200 is controlled by the control unit 1080.

The robot 1000 includes the piezoelectric motors 200 (vibrators 1), and thereby, may enjoy the above described advantages of the vibrators 1 and may exert good reliability.

Fifth Embodiment

Next, an electronic component conveyance apparatus according to the fifth embodiment of the invention will be explained.

Figure 23:
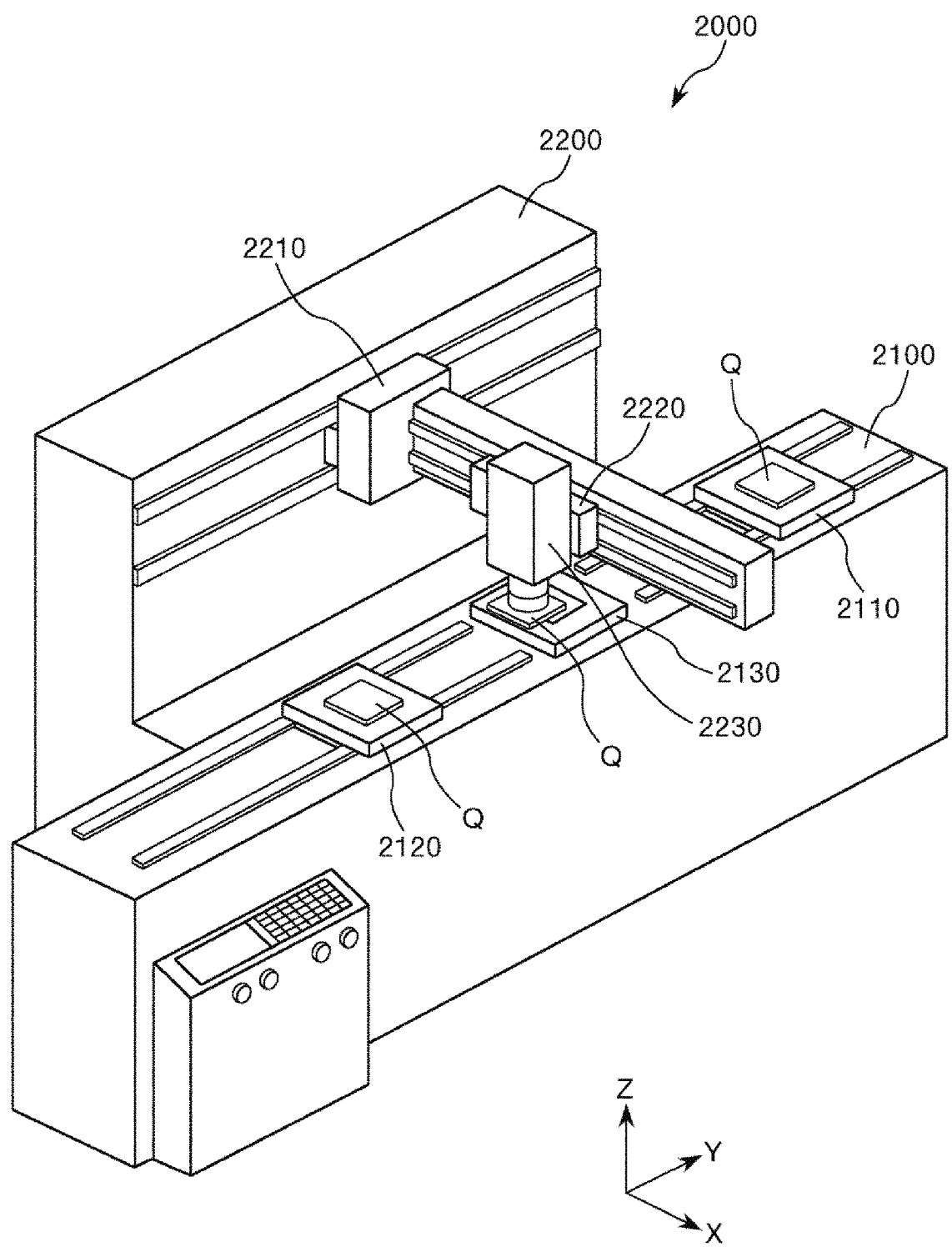
FIG. 23 is a perspective view of an electronic component conveyance apparatus according to the fifth embodiment of the invention.
Figure 24:
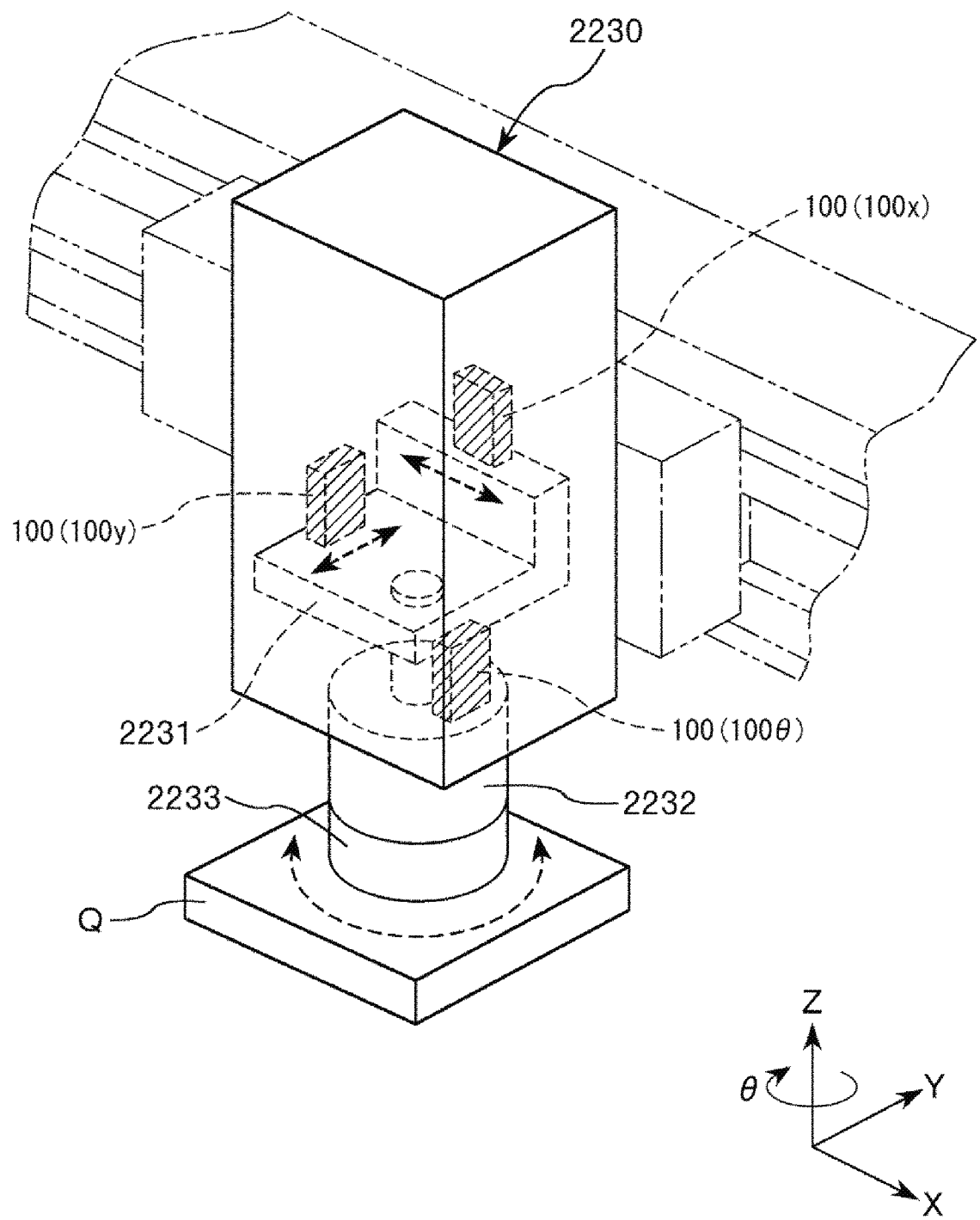
FIG. 24 is perspective view of an electronic component holding part of the electronic component conveyance apparatus shown in FIG. 23.

FIG. 23 is a perspective view of the electronic component conveyance apparatus according to the fifth embodiment of the invention. FIG. 24 is perspective view of an electronic component holding part of the electronic component conveyance apparatus shown in FIG. 23. Note that, hereinafter, for convenience of explanation, three axes orthogonal to one another are an X-axis, a Y-axis, and a Z-axis.

The electronic component conveyance apparatus 2000 shown in FIG. 23 is applied to an electronic component inspection apparatus, and includes a base 2100 and a support 2200 provided on the side of the base 2100. Further, on the base 2100, an upstream stage 2110 on which an electronic component Q to be inspected is mounted and conveyed in the Y-axis direction, a downstream stage 2120 on which an electronic component Q that has been inspected is mounted and conveyed in the Y-axis direction, and an inspection table 2130 located between the upstream stage 2110 and the downstream stage 2120, on which electrical characteristics of an electronic component Q is inspected are provided. Note that examples of the electronic component Q include e.g. a semiconductor, semiconductor wafer, display device such as CLD and OLED, quartz device, various sensors, inkjet head, various MEMS devices, etc.

Further, a Y-stage 2210 movable in the Y-axis directions with respect to the support 2200 is provided on the support 2200, an X-stage 2220 movable in the X-axis directions with respect to the Y-stage 2210 is provided on the Y-stage 2210, and an electronic component holding part 2230 movable in the Z-axis directions with respect to the X-stage 2220 is provided on the X-stage 2220.

As shown in FIG. 24, the electronic component holding part 2230 includes a fine adjustment plate 2231 movable in the X-axis directions and the Y-axis directions, a rotation part 2232 rotatable about the Z-axis with respect to the fine adjustment plate 2231, and a holding part 2233 provided in the rotation part 2232 and holding the electronic component Q. Further, in the electronic component holding part 2230, a piezoelectric actuator 100 (100x) for moving the fine adjustment plate 2231 in the X-axis directions, a piezoelectric actuator 100 (100y) for moving the fine adjustment plate 2231 in the Y-axis directions, and a piezoelectric actuator 100 (100θ) for rotating the rotation part 2232 about the Z-axis are provided.

The electronic component conveyance apparatus 2000 includes the piezoelectric actuators 100 (vibrators 1), and thereby, may enjoy the above described advantages of the vibrators 1 and may exert good reliability.

As above, the vibrator, piezoelectric actuator, piezoelectric motor, robot, and electronic component conveyance apparatus according to the invention are explained based on the illustrated embodiments, however, the invention is not limited to those. The configurations of the respective parts may be replaced by arbitrary configurations having the same functions. Further, other arbitrary configurations may be added to the invention. Furthermore, the respective embodiments may be appropriately combined.

Further, in the above described embodiments, the configurations in which the vibrators are applied to the robot and the electronic component conveyance apparatus are explained, however, the vibrators may be applied to other various electronic devices than those. Specifically, for example, the vibrators (piezoelectric actuators, piezoelectric motors) may be applied to drive sources of feeding rollers of printers, drive sources of inkjet heads of printers, etc.

The entire disclosure of Japanese Patent Application No. 2016-170176, filed Aug. 31, 2016 is expressly incorporated by reference herein.

What is claimed is:

1. A vibrator comprising:
a vibrating part including a pair of vibrating plates and a piezoelectric material provided between the pair of vibrating plates;
a supporting part including a pair of supporting plates and an interplate portion provided between the pair of supporting plates; and
a wire provided in the vibrating part and the supporting part,
wherein the wire is exposed from the supporting part.

2. The vibrator according to claim 1, wherein the interplate portion has an insulation property.

3. The vibrator according to claim 1, further comprising:
a first substrate including one of the vibrating plates and one of the supporting plates; and
a second substrate including the other of the vibrating plates and the other of the supporting plates.

4. The vibrator according to claim 3, wherein the interplate portion has a smaller thickness than the piezoelectric material in a direction in which the first substrate and the second substrate overlap.

5. The vibrator according to claim 3, wherein the wire includes a first wire provided on the first substrate and a second wire provided on the second substrate.

6. The vibrator according to claim 1, wherein the supporting part includes a concave portion opening to a surface and the wire is exposed in the concave portion.

7. The vibrator according to claim 1, further comprising a conductor portion in contact with the exposed portion of the wire.

8. The vibrator according to claim 7, wherein the conductor portion is provided to protrude from the supporting part.

9. The vibrator according to claim 1, further comprising a plurality of the piezoelectric materials stacked along a direction in which the pair of vibrating plates overlap between the pair of vibrating plates.

10. A piezoelectric motor comprising:
the vibrator according to claim 1;
a convex portion provided at an edge of the vibrating part of the vibrator; and
a rotor configured to rotate with respect to a rotation axis,
wherein a vibration of the vibrator is configured to be transferred to the rotor via the convex portion so as to rotate the rotor with respect to the rotation axis.

11. The piezoelectric motor according to claim 10, wherein the interplate portion of the vibrator has an insulation property.

12. A robot comprising:
a base;
a first arm fixed to the base via a first joint;
a second arm fixed to the first arm via a second joint; and
a piezoelectric motor disposed in at least one of the first joint or the second joint, the piezoelectric motor being configured with:
a vibrator, the vibrator having:
a vibrating part including a pair of vibrating plates and a piezoelectric material provided between the pair of vibrating plates;
a supporting part including a pair of supporting plates and an interplate portion provided between the pair of supporting plates; and
a wire provided in the vibrating part and the supporting part; and
a convex portion provided at an edge of the vibrating part of the vibrator; and
a rotor configured to rotate with respect to a rotation axis so as to move at least one of the first arm or the second arm,
wherein the wire is exposed from the supporting part, and
a vibration of the vibrator is configured to be transferred to the rotor via the convex portion so as to rotate the rotor and move at least one of the first arm or the second arm.

13. The robot according to claim 12,
wherein the interplate portion of the vibrator has an insulation property.

14. An electronic component conveyance apparatus comprising:
the vibrator according to claim 1;
a convex portion provided at an edge of the vibrating part of the vibrator;
a rotor configured to rotate with respect to a rotation axis;
a support;
a first stage disposed on the support, the first stage being configured to move along a first axis with respect to the support;
a second stage disposed on the first stage, the second stage being configured to move along a second axis with respect to the first stage, the first axis being perpendicular to the second axis; and
an electronic component holder disposed on the second stage, the electronic component holder being configured to move along a third axis with respect to the second stage, the third axis being perpendicular to the first and second axes, wherein the vibrator, the convex portion, and the rotor are disposed in the electronic component holder, and a vibration of the vibrator is configured to be transferred to the rotor via the convex portion to rotate the rotor so that a part of the electronic component holder rotates around the third axis.

15. The electronic component conveyance apparatus according to claim 14, wherein the interplate portion of the vibrator has an insulation property.

16. A piezoelectric actuator comprising:

a vibrator, the vibrator having:

a vibrating part including a pair of vibrating plates and a piezoelectric material provided between the pair of vibrating plates;

a supporting part including a pair of supporting plates and an interplate portion provided between the pair of supporting plates; and a wire provided in the vibrating part and the supporting part; and a convex portion provided at an edge of the vibrating part of the vibrator, wherein the wire is exposed from the supporting part.

17. The piezoelectric actuator according to claim 16, wherein the interplate portion of the vibrator has an insulation property.

18. The piezoelectric actuator according to claim 16, wherein the vibrator is configured as a plurality of vibrators, and the plurality of the vibrators are stacked.

19. The piezoelectric actuator according to claim 16, further comprising a circuit component electrically connected to the wire in the supporting part.

* * * * *